(12) United States Patent
Ogiwara et al.

(10) Patent No.: US 7,046,541 B2
(45) Date of Patent: May 16, 2006

(54) SEMICONDUCTOR INTEGRATED CIRCUIT DEVICE

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/830,046

(22) Filed: Apr. 23, 2004

(65) Prior Publication Data

US 2005/0128780 A1 Jun. 16, 2005

(30) Foreign Application Priority Data

Dec. 10, 2003 (JP) ............................. 2003-411430

(51) Int. Cl.
*G11C 11/22* (2006.01)

(52) U.S. Cl. ................. 365/145; 365/189.09; 365/211; 365/212

(58) Field of Classification Search ........... 365/189.09, 365/226, 145, 211, 212
See application file for complete search history.

(56) References Cited

U.S. PATENT DOCUMENTS

| 5,487,029 A * | 1/1996 | Kuroda ........................ 365/145 |
| 5,550,770 A * | 8/1996 | Kuroda ........................ 365/145 |
| 6,856,573 B1* | 2/2005 | Allen et al. ............ 365/230.06 |
| 2004/0090826 A1* | 5/2004 | Ogiwara et al. ....... 365/189.07 |

OTHER PUBLICATIONS

M. Takeo, et al., IEEE, IEDM 97, ICMTS, pp. 621-624, "SRBI$_2$TA$_2$O$_9$ Thin Film Capacitor Model Including Polarization Reversal Response for Nanosecond Range Circuit Simulation of Ferroelectric Nonvolatile Memory", 1997.

* cited by examiner

*Primary Examiner*—Son Mai
(74) *Attorney, Agent, or Firm*—Oblon, Spivak, McClelland, Maier & Neustadt

(57) ABSTRACT

There is disclosed a semiconductor integrated circuit device comprising a memory cell array including a memory cell having a ferroelectric capacitor having first and second electrodes. A first bit line is electrically connected to the first electrode. A first potential generation circuit supplies a first potential to the second electrode to apply a voltage which drops at a first rate of change with a rise of temperature to the ferroelectric capacitor. A sense amplifier amplifies a potential difference between the first bit line and a second bit line complementary to the first bit line.

17 Claims, 16 Drawing Sheets

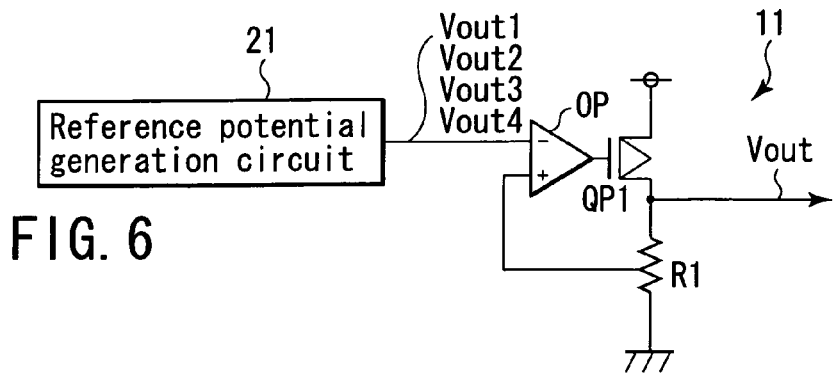
FIG. 6
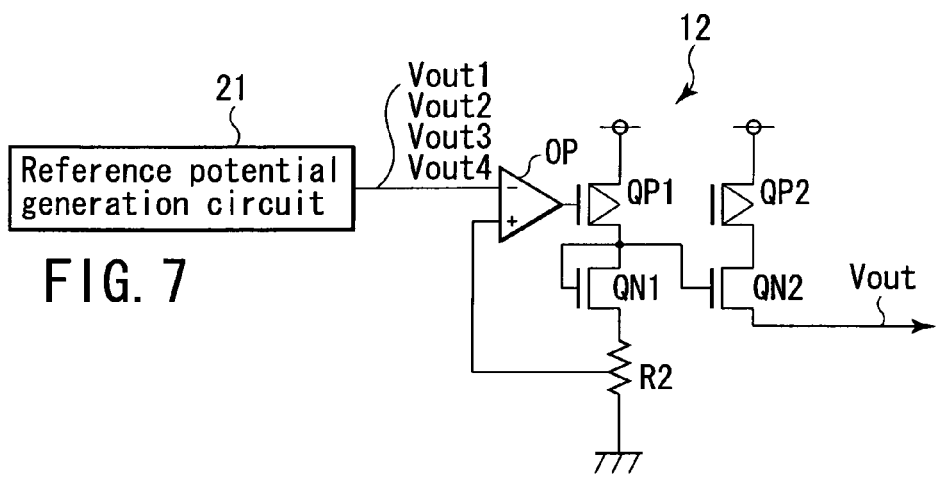
FIG. 7
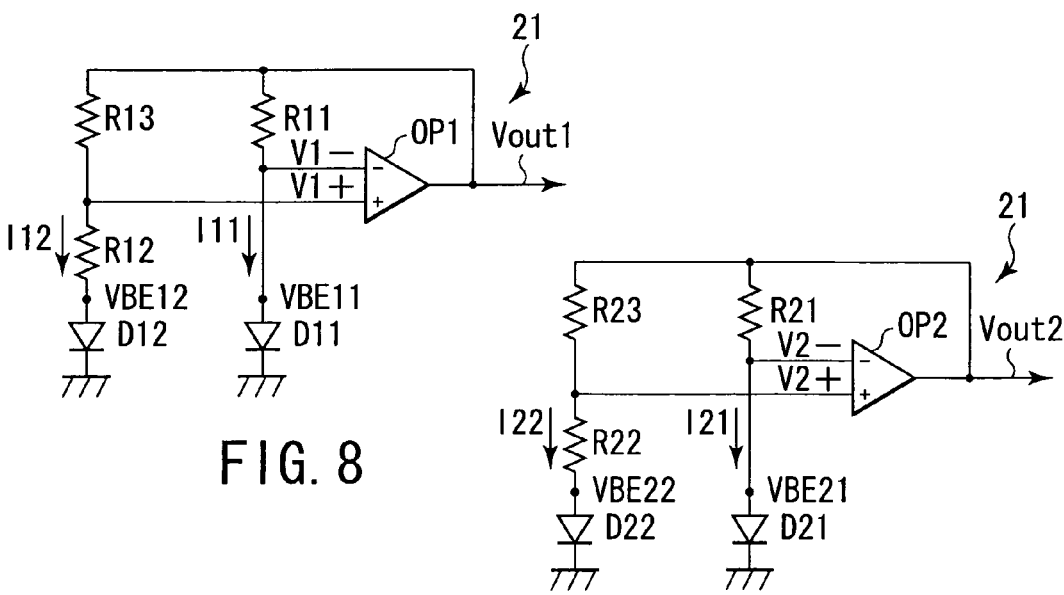
FIG. 8
FIG. 9

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2003-411430, filed Dec. 10, 2003, the entire contents of which are incorporated herein by reference.

BACKGROUND OF THE INVENTION

1. Field of the Invention

The present invention relates to a semiconductor integrated circuit device, particularly to a potential generation circuit of a semiconductor storage device using a ferroelectric capacitor.

2. Description of the Related Art

In a ferroelectric capacitor, an applied voltage and a polarization amount have a hysteresis characteristic, and the capacitor has residual dielectric polarization when the applied voltage is zero. A ferroelectric random access memory (FeRAM) using the characteristics has been known. Data is written or read, when a voltage generated between a plate line and a bit line is applied to the ferroelectric capacitor. The data read into the bit line is amplified by a sense amplifier.

For the ferroelectric capacitor, several characteristics change in accordance with temperature, and one of the characteristics correspond to a hysteresis characteristic. FIG. 33 shows the hysteresis characteristic at a low temperature, and FIG. 34 shows the hysteresis characteristic at a high temperature. As shown in FIGS. 33, 34, a voltage (saturated voltage) VTL required for saturation of a residual dielectric polarization amount and the polarization amount increases at the low temperature, therefore hysteresis increases. The residual dielectric polarization amount and saturated voltage VTH decrease at the high temperature, therefore the hysteresis decreases.

On the other hand, a potential applied to the plate line has been a fixed value regardless of the temperature. Therefore, a plate line driving potential at the low temperature needs to be used in order to assure normal write and read of the data regardless of the temperature. As a result, a voltage VA which is greater than the saturated voltage VTH at the high temperature is applied to the ferroelectric capacitor at the high temperature. This excessive voltage does not contribute to the increase of the written polarization amount at all, and is useless. Additionally, imprint of the hysteresis characteristic (shift of hysteresis) or fatigue of a ferroelectric film occurs. This causes a deterioration of reliability of a ferroelectric memory.

Time required for polarization reverse (polarization reverse time) is another one of the characteristics of the ferroelectric capacitor which change at the temperature. FIGS. 35, 36, 37 show the polarization reverse time at 70° C., 25° C., −25° C. Curves in the drawings show differences of the applied voltages. As shown in FIGS. 35 to 37, a time required until the polarization amount is saturated after the polarization reverse is short at the high temperature, and the time is long at the low temperature. Note that FIGS. 35 to 37 relate to an SBT ($SrBi_2Ta_2O_9$) film, and this also applies to a PZT ($Pb(Zr,Ti)O_3$) film.

On the other hand, a time for driving the plate line and a time for activating the sense amplifier have been a fixed values regardless of the temperature. FIG. 38 shows a timing chart of major nodes of a conventional ferroelectric memory. As shown in FIG. 38, the data is read and written involving the polarization reverse of data "1" from t31 for the driving of the plate line until t32 for the sense amplification, and from t33 for a drop of a plate line driving potential to VSS until t34 for sense amplifier inactivation. The polarization reverse time at the low temperature needs to be used in order to assure a series of normal operation regardless of the temperature. As a result, the voltage continues to be applied over the polarization reverse time at the high temperature or longer at the high temperature. This causes the imprint and fatigue, and deteriorates the reliability of the ferroelectric memory.

BRIEF SUMMARY OF THE INVENTION

According to a first aspect of the invention, there is provided a semiconductor integrated circuit device comprising: a memory cell array including a memory cell having a ferroelectric capacitor as a storage element, the memory cell having a first electrode and a second electrode; a first bit line electrically connected to the first electrode; a second bit line complementary to the first bit line; a first potential generation circuit which supplies a first potential to the second electrode to apply a voltage dropping at a first rate of change with a rise of temperature to the ferroelectric capacitor; and a sense amplifier which amplifies a potential difference between the first bit line and the second bit line.

According to a second aspect of the invention, there is provided a semiconductor integrated circuit device comprising: a memory cell array including a memory cell having a ferroelectric capacitor as a storage element, the memory cell having a first electrode and a second electrode; a first bit line electrically connected to the first electrode; a first bit line complementary to the first bit line; a sense amplifier which amplifies a potential difference between the first bit line and the second bit line; and a second potential generation circuit supplying a voltage as a power potential of the sense amplifier, the voltage dropping at a second rate of change with a rise of temperature.

According to a third aspect of the invention, there is provided a semiconductor integrated circuit device comprising: a memory cell array including a memory cell having a ferroelectric capacitor as a storage element, the memory cell having a first electrode and a second electrode; a first bit line electrically connected to the first electrode; a second bit line complementary to the first bit line; and a circuit which supplies a first potential to the second electrode to read information, a time for which the first potential is supplied dropping with a rise of temperature.

According to a fourth aspect of the invention, there is provided a semiconductor integrated circuit device comprising: a memory cell array including a memory cell having a ferroelectric capacitor as a storage element, the memory cell having a first electrode and a second electrode; a first bit line electrically connected to the first electrode; a second bit line complementary to the first bit line; a first circuit which supplies a first potential to the second electrode to read information; a sense amplifier which amplifies a potential difference between the first bit line and the second bit line; and a second circuit which supplies a second potential as a power potential of the sense amplifier, a time for which the second potential is supplied dropping with a rise of temperature after the first potential is set at a low level.

BRIEF DESCRIPTION OF THE SEVERAL VIEWS OF THE DRAWING

FIG. 6 is a diagram showing one example of a potential generation circuit according to the first embodiment;

FIG. 7 is a diagram showing one example of the potential generation circuit according to the first embodiment;

FIG. 8 is a diagram showing a reference potential generation circuit according to the first embodiment;

FIG. 9 is a diagram showing the reference potential generation circuit according to the first embodiment;

DETAILED DESCRIPTION OF THE INVENTION

Figure 1:
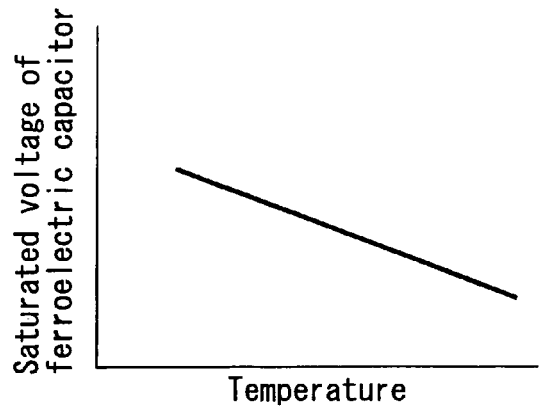
FIG. 1 is a diagram showing a relation between a saturated voltage of a ferroelectric capacitor and a temperature.

Embodiments of the present invention will hereinafter be described with reference to the accompanying drawings. It is to be noted that constituting elements having substantially the same function and constitution are denoted with the same reference numerals in the following description, and redundant description is performed only if necessary.

The respective embodiments of the present invention include peripheral circuits such as a potential generation circuit and a sense amplifier of a ferroelectric memory. Therefore, the present invention can be applied to any ferroelectric memory regardless of the constitution of a memory cell array. The embodiments including the constitution of a typical ferroelectric memory cell array as an example will now be described.

First Embodiment

FIG. 1 shows a relation between a saturated voltage of a ferroelectric capacitor and a temperature. As shown in FIG. 1, the saturated voltage drops with a rise of temperature. A first embodiment is characterized in that the potentials generated by a sense amplifier supply potential generation circuit and a plate line driving potential generation circuit have temperature characteristics similar to those of FIG. 1.

Figure 3:
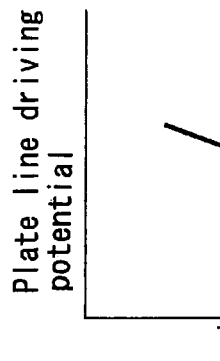
FIG. 3 is a diagram showing a relation between a plate line driving potential and temperature in the first embodiment.
Figure 2:
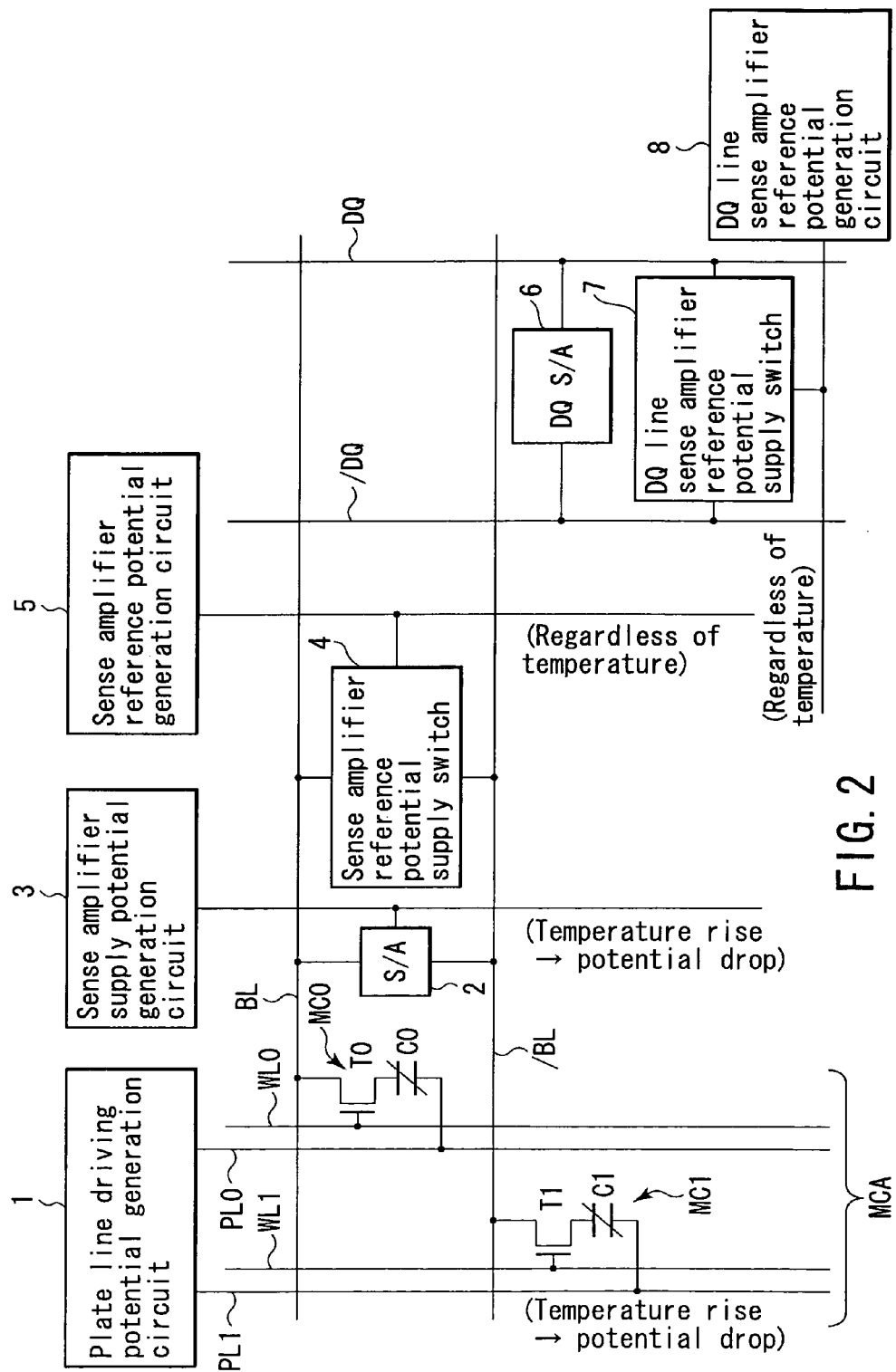
FIG. 2 is a diagram showing a major part of a semiconductor integrated circuit device according to a first embodiment of the present invention.

FIG. 2 is a diagram showing a constitution of a major part of a semiconductor integrated circuit device according to the first embodiment of the present invention. As a typical example, an example is shown in which each memory cell in a memory cell array MCA is constituted of one transistor and one ferroelectric capacitor. As shown in FIG. 1, a plate line driving potential generation circuit 1 supplies a plate line driving potential to plate lines PL0, PL1. As shown in FIG. 3, the plate line driving potential is designed to have a value in accordance with a temperature characteristic similar to that of a saturated voltage of the ferroelectric capacitor.

A memory cell MC0 is constituted of series-connected ferroelectric capacitor C0 and cell transistor T0 including a metal oxide semiconductor (MOS) transistor. One end of the memory cell MC0 is connected to the plate line PL0, and the other end is connected to a bit line BL. The gate of the cell transistor T0 is connected to a word line WL0. One end of a memory cell MC1 having a constitution similar to that of the memory cell MC0 is connected to the plate line PL1, and the other end is connected to a bit line /BL. It is possible to use any known material such as SBT and PZT in a ferroelectric film of the ferroelectric capacitor C0.

Figure 4:
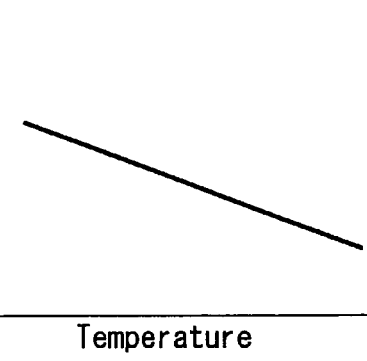
FIG. 4 is a diagram showing a relation between a sense amplifier supply potential and temperature in the first embodiment.

A sense amplifier 2 for amplifying a potential difference between the bit lines BL, /BL is disposed between the bit lines. A sense amplifier supply potential generation circuit 3 supplies a sense amplifier supply potential to the sense amplifier 2. The sense amplifier 2 uses this supplied potential as a power potential to operate. As shown in FIG. 4, the sense amplifier supply potential is designed to have a value in accordance with the temperature characteristic similar to that of the saturated voltage of the ferroelectric capacitor.

A sense amplifier reference potential supply switch 4 is connected between the bit lines BL, /BL. A sense amplifier reference potential generation circuit 5 generates a reference potential which does not depend on the temperature. The sense amplifier reference potential supply switch 4 selectively supplies the reference potential to the bit lines BL, /BL.

A DQ line sense amplifier 6 for amplifying the potential difference between a DQ line pair DQ, /DQ for data transfer is connected between the DQ lines connected to a data I/O pad (not shown). A DQ line sense amplifier reference potential supply switch 7 is connected between the DQ line pair DQ, /DQ. A DQ line sense amplifier reference potential generation circuit 8 generates a reference potential which does not depend on the temperature. The DQ line sense amplifier reference potential supply switch 7 selectively supplies the reference potential to one of the DQ line pair DQ, /DQ.

Figure 5:
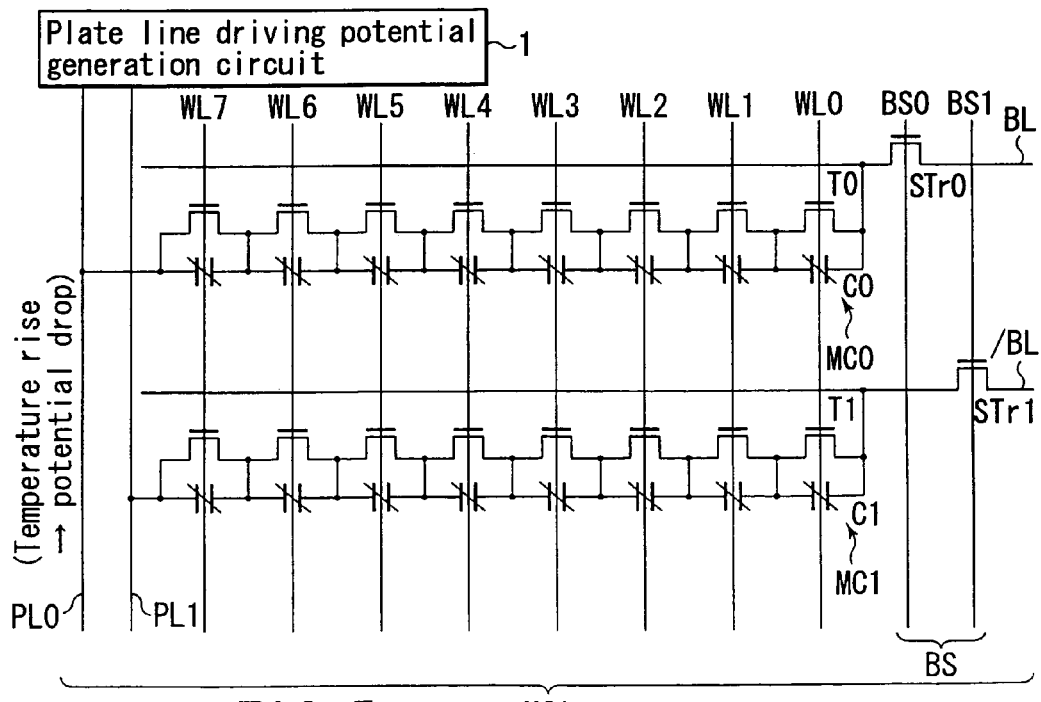
FIG. 5 is a diagram showing the major part of the semiconductor integrated circuit device according to the first embodiment.

FIG. 5 is a diagram showing another constitution of the major part of the semiconductor integrated circuit device according to the first embodiment. In this example, only the memory cell array MCA is shown, and the other parts are the same as those of FIG. 1. As shown in FIG. 2, the memory cell MC0 is constituted of parallel-connected ferroelectric capacitor C0 and cell transistor T0. One end of a memory cell group in which memory cells MC0 are connected (FIG. 2 show eight cells) is connected to the plate line PL0, and the other end is connected to the bit line BL via a block selection transistor STr0. The gate of the cell transistor T0 of each memory cell MC0 is connected to word lines WL0 to WL7. A block selection signal BS0 is supplied to the gate of the block selection transistor STr0.

Similarly, memory cells MC1 each constituted of parallel-connected ferroelectric capacitor C1 and cell transistor T1 are connected in series. One end of the memory cell group constituted of a plurality of memory cells MC1 is connected to the plate line PL1, and the other end is connected to the bit line /BL via a block selection transistor STr1. The gate of the cell transistor T1 of each memory cell MC1 is connected to the word lines WL0 to WL7. A block selection signal BS1 is supplied to the gate of the block selection transistor STr1.

Next, the plate line driving potential generation circuit 1, sense amplifier supply potential generation circuit 3, sense amplifier reference potential generation circuit 5, and DQ line sense amplifier reference potential generation circuit 8 of FIGS. 2 and 5 will now be described with reference to FIGS. 6 to 9.

FIG. 6 is a circuit diagram showing a potential generation circuit 11 usable in the plate line driving potential generation circuit 1, sense amplifier supply potential generation circuit 3, sense amplifier reference potential generation circuit 5, and DQ line sense amplifier reference potential generation circuit 8. As shown in FIG. 6, potentials Vout1 to Vout4 generated by a reference potential generation circuit 21 are supplied to a reverse input end of an operational amplifier OP. As described later, dependence on temperature is imparted to the output voltages Vout1 to Vout4 of the reference potential generation circuit 21, or the voltages are set to be constant regardless of the temperature, and the temperature characteristic of an output potential Vout of the potential generation circuit 11 is accordingly adjusted.

An output end of the operational amplifier OP is connected to the gate of a P-type MOS transistor QP1. The source of the transistor QP1 is connected to a power potential line, and the drain outputs the output potential Vout. The output potential Vout is divided by a resistance element R1, and is supplied to a non-reverse input end of the operational amplifier OP. Potential division by a resistance element R1 is appropriately adjusted to obtain the output potential Vout having a desired value.

FIG. 7 is a circuit diagram showing a potential generation circuit 12 usable in the plate line driving potential generation circuit 1, sense amplifier supply potential generation circuit 3, sense amplifier reference potential generation circuit 5, and DQ line sense amplifier reference potential generation circuit 8. As shown in FIG. 7, the drain of the transistor QP1 is connected to the drain and gate of an N-type MOS transistor QN1. The potential of the source of the transistor QN1 is divided by a resistance element R2, and is supplied to the non-reverse input end of the operational amplifier OP. The source of a P-type MOS transistor QP2 is connected to the power potential line, and the drain is connected to that of an N-type MOS transistor QN2. The gate of the transistor QN2 is connected to that of the transistor QN1, and the source outputs the output potential Vout. The potential division by the resistance element R2 is appropriately adjusted to set the output potential Vout to the desired value in the same manner as in the circuit of FIG. 6.

Next, the reference potential generation circuit 21 will be described with reference to FIGS. 8, 9. FIG. 8 is a diagram showing the reference potential generation circuit 21 applicable to the potential generation circuit of FIG. 7. The circuit of FIG. 8 is called a band gap reference (BGR) using a diode. As shown in FIG. 8, the reverse input end of an operational amplifier OP1 is connected to the anode of a diode D11. The cathode of the diode D11 is grounded. The reverse input end is also connected to the output end of the operational amplifier OP1 via a resistance R11. The non-reverse input end of an operational amplifier OP2 is connected to the anode of a diode D12 via a resistance R12. The cathode of the diode D12 is grounded. The reverse input end is also connected to the output end of the operational amplifier OP1 via a resistance R13.

Next, a method of using the reference potential generation circuit 21 of FIG. 8 to generate the reference potential which does not depend on the temperature will be described. Currents I11, I12 are as follows:

$$I11 = I_s \cdot \exp\{q \cdot VBE11/(k \cdot T)\} \qquad (1);$$

$$I12 = I_s \cdot \exp\{q \cdot VBE12/(k \cdot T)\} \qquad (2); \text{ and}$$

$$I11/I12 = N \qquad (37)$$

From (1), (2), and (37), the following results:

$$\ln(I11/I12) = \ln(N) = \{q/(k \cdot T)\} \cdot (VBE11 - VBE12) \qquad (3).$$

From FIG. 8, the following result:

$$Vout1-VBE11=I11 \cdot R11 \quad (4); \text{ and}$$

$$Vout1-VBE12=I12 \cdot (R12+R13) \quad (5).$$

Moreover, since $V1_-=V1_+$, the following results:

$$R11 \cdot I11 = R13 \cdot I12 \quad (6).$$

From (4), (6), the following result:

$$Vout1-VBE11=I12 \cdot R13 \quad (7); \text{ and}$$

$$I12=(Vout1-VBE11)/R13 \quad (8).$$

From (5), the following results:

$$I12=(Vout1-VBE12)/(R12+R13) \quad (9).$$

From (8), (9), the following result:

$$Vout1 = (R12+R13)/R12 \cdot VBE11 - (R13/R12) \cdot VBE12 \quad (10)$$

$$= (1+R13/R12) \cdot VBE11 - (R13/R12) \cdot VBE12. \quad (11)$$

From (11), (3), the following results:

$$Vout1=VBE11+(R13/R12) \cdot (k \cdot T/q) \cdot \ln(I11/I12) \quad (12),$$

where VBE11 has the temperature characteristic substantially of −2 [mV/degree]. Therefore, as conditions for setting the output potential Vout1 in dependent from the temperature, the temperature characteristic of VBE11 needs to be cancelled by terms other than VBE11 on the right side of (12), and therefore the following results:

$$(R13/R12) \cdot (k/q) \cdot \ln(I11/I12) = +2/1000 \quad (13)$$

where the values of k and q are the following constants:

$$k=1.38 \cdot 10^{-23} \text{ [J/K]} \quad (14); \text{ and}$$

$$q=1.602 \cdot 10^{-19} \text{ [C]} \quad (15).$$

Therefore, the following results:

$$(R13/R12) \cdot \ln(I11/I12) = (R13/R12) \cdot \ln(N) = +23.2 \quad (16).$$

From (6), R13 is as follows:

$$R13=(I11/I12) \cdot R11=N \cdot R11 [\Omega] \quad (17).$$

From (16), R12 is as follows:

$$R12=R13 \cdot \ln(N)/23.2 [\Omega] \quad (18).$$

The areas of the diodes D11, D12 and R11 are used to determine R13 from Equation (17) obtained in this manner. Here, R11 is determined by a consumed current permitted in the circuit. Subsequently, R12 is determined in accordance with Equation (18).

Next, a method of using the reference potential generation circuit 21 of FIG. 9 to generate the reference potential which is dependent on the temperature, and a method of setting the reference potential in accordance with the temperature characteristic of the ferroelectric capacitor will be described. The circuit constitution of FIG. 9 is identical to that of FIG. 8. For the reference numerals of each part of FIG. 9, a part of affix of each reference numeral is 2, and a digit of 10 is denoted with 2. It is to be noted that the plate line driving potential will now be described, but the sense amplifier supply potential can also be set by the same method.

Assuming that the temperature characteristic of a plate line driving potential Vp1 of FIG. 3 is −P1 [mV/degree], a temperature characteristic −X1 [mV/degree] to be possessed by Vout2 in FIG. 9 is as follows:

$$-X1=-P1 \cdot (Vout2/Vp1) \text{[mV/degree]} \quad (19).$$

Moreover, the following is necessary for Vout2 in FIG. 9 to have the temperature characteristic of −X1 [mV/degree]:

$$(R23/R22) \cdot (k/q) \cdot \ln(I21/I22)=(-X1+2)/1000 \quad (20).$$

When the values of k and q are assigned to the above, the following results:

$$(R23/R22) \cdot \ln(I21/I22) = (R23/R22) \cdot \ln(N) \quad (21)$$

$$= (-X1+2) \cdot 11.6.$$

Since the relation of (6) is established even in FIG. 9, R23 is as follows:

$$R23=(I21/I22) \cdot R21=N \cdot R21 \quad (22).$$

Moreover, from (21), R22 is as follows:

$$R22=R23 \cdot \ln(N)/\{(-X1+2) \cdot 11.6\} \quad (23).$$

From Equation (22) obtained in this manner, the areas of diodes D21, D22 and R21 are used to determine R23. Here, R21 is determined by the consumed current permitted in the circuit. Subsequently, R22 is determined in accordance with Equation (23).

Figure 10:
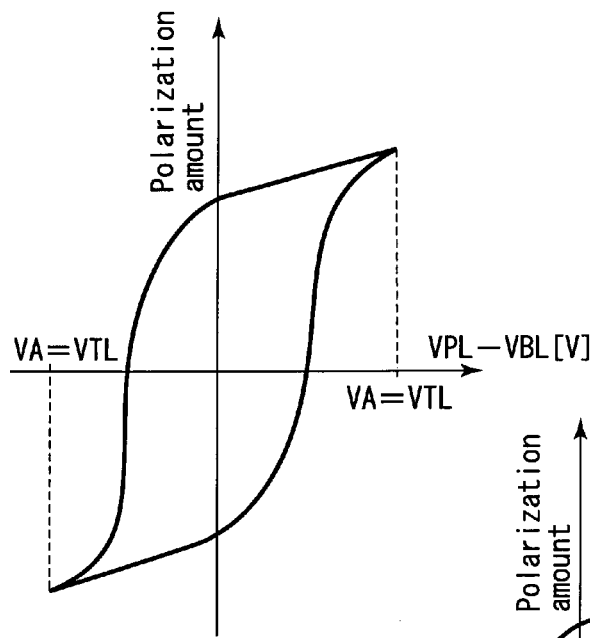
FIG. 10 is a diagram showing the saturated voltage and an applied voltage at a low temperature in the first embodiment.
Figure 11:
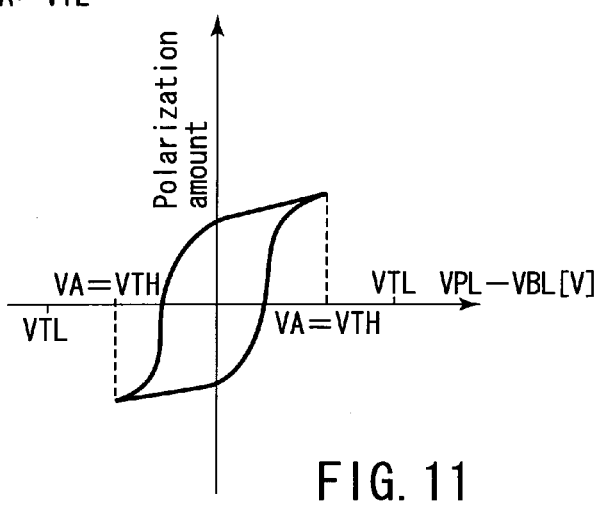
FIG. 11 is a diagram showing the saturated voltage and the applied voltage at a high temperature in the first embodiment.

Next, an effect obtained by the first embodiment will be described with reference to FIGS. 10, 11. FIG. 10 shows that a voltage VA (=VPL−VBL) is applied to the ferroelectric capacitor at a low temperature by the semiconductor integrated circuit device according to the first embodiment. FIG. 11 shows that the voltage VA is applied to the ferroelectric capacitor at a high temperature. As shown in FIGS. 10, 11, the voltage VA applied to the ferroelectric capacitor is constantly set to the saturated voltage in accordance with the temperature. Therefore, the application of the saturated voltage at the low temperature can be avoided at the high temperature.

According to the semiconductor integrated circuit device of the first embodiment of the present invention, the plate line driving potential generation circuit 1 and the sense amplifier supply potential generation circuit 3 generate a potential which drops with a rise of temperature in accordance with a rate of change in the same manner as in the temperature characteristic of the saturated voltage of the ferroelectric film. Therefore, even when the temperature changes, the voltage applied to the ferroelectric capacitor C0 (C1) agrees with the saturated voltage at the temperature. Therefore, the voltage which is greater than the saturated voltage can be prevented from being applied to the ferroelectric capacitor C0. Therefore, imprint of a hysteresis characteristic and fatigue of the ferroelectric film are prevented from occurring, and the semiconductor integrated circuit device having a high reliability can be realized.

It is to be noted that a constant potential which does not depend on the temperature in the same manner as in the sense amplifier reference potential and DQ line sense amplifier reference potential is supplied to other peripheral circuits such as a row address buffer not shown in FIGS. 2 and 5.

Second Embodiment

In a second embodiment, in addition to the characteristics of the first embodiment, the sense amplifier reference potential also has dependence on the temperature. Prior to the description of the second embodiment, a relation between distribution of a signal potential at the time of read of "0" and "1" data and the reference potential will be described.

Figure 12:
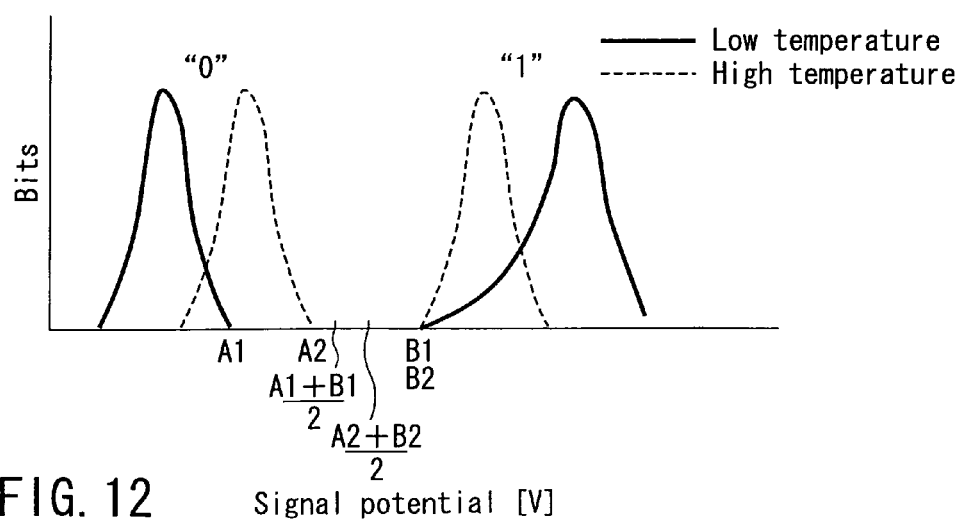
FIG. 12 is a diagram showing a "0" and "1" signal distribution at the high and low temperatures.

An intermediate point between a peak of the distribution of the signal potential at the "0" read time and a peak of the distribution of the signal potential at the "1" read time is constant regardless of the temperature. Therefore, this intermediate point has been used as the reference potential of the sense amplifier. However, as shown in FIG. 12, it has been found that a distribution shape of a read signal potential has a long trailing shape in reading "1" at the low temperature. Therefore, at the low temperature, the intermediate point between a maximum signal potential A1 of the "0" read and a minimum potential B1 of the "1" read deviates from that between the peaks. Therefore, assuming that the potential of intermediate point between the peaks is the reference potential, a margin during sensing at the low temperature decreases.

Figures 13, 15:
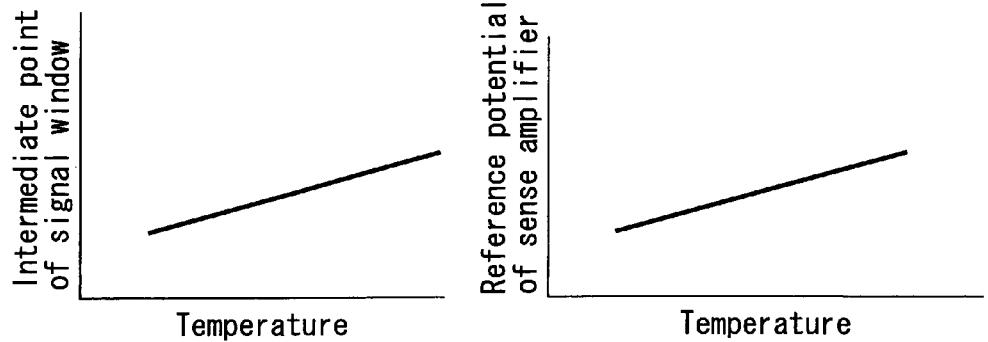
FIG. 13 is a diagram showing a relation between an intermediate point of a signal window and temperature.
FIG. 15 is a diagram showing a relation between a sense amplifier reference potential and temperature in the second embodiment.

FIG. 13 shows a relation between the intermediate point between the maximum potential at the "0" read time and the minimum potential at the "1" read time (signal window) and the temperature. As shown in FIG. 13, the intermediate point of the signal window rises with the rise of the temperature. Then, a technique has been proposed in which the signal margin is secured regardless of the temperature using this intermediate point as the reference potential, and is described in detail in Jpn. Pat. Appln. No. 2002-321563. In the second embodiment, this technique is used.

Figure 14:
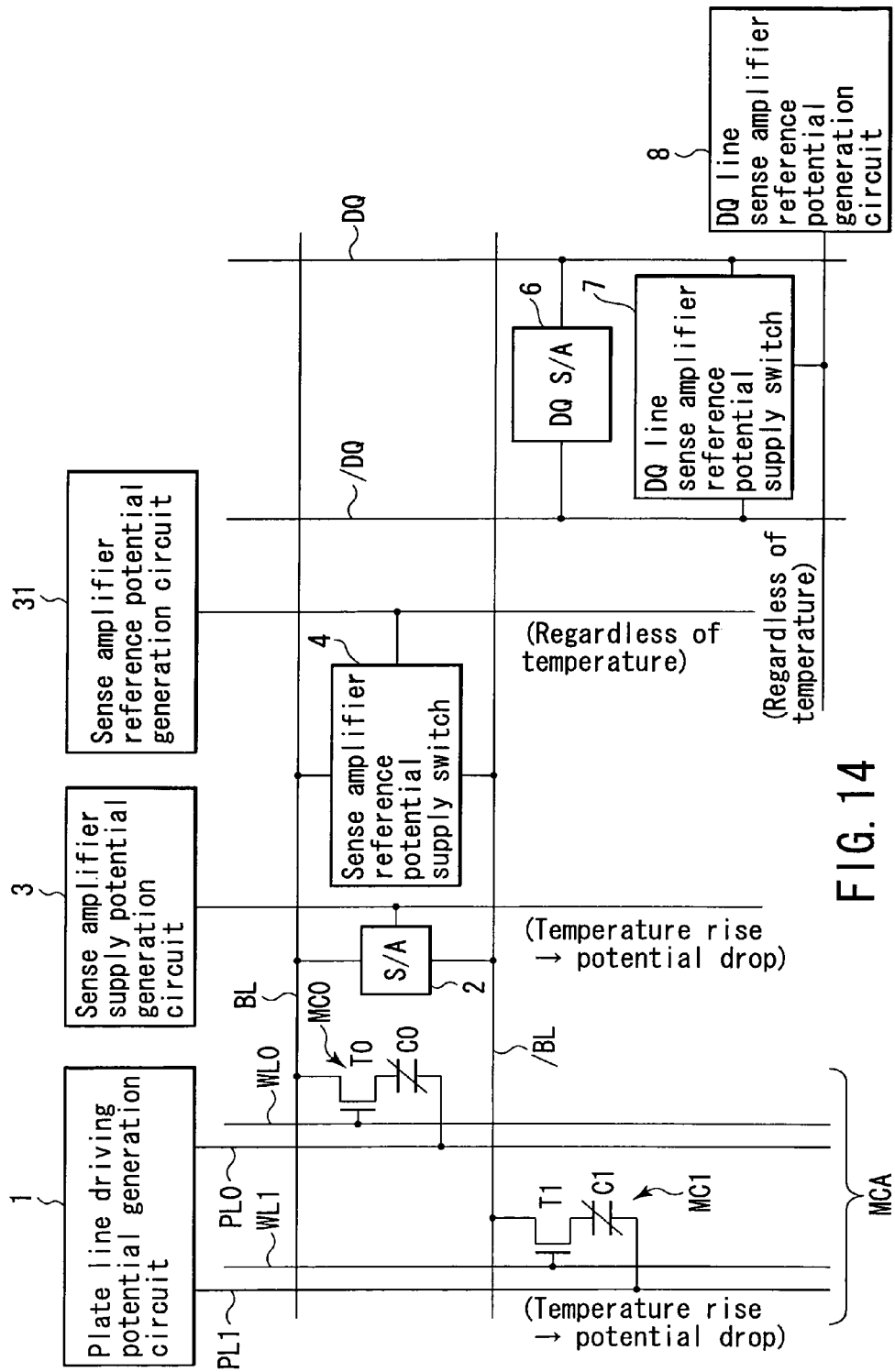
FIG. 14 is a diagram showing a constitution of the major part of the semiconductor integrated circuit device according to a second embodiment of the present invention.

FIG. 14 is a diagram showing the constitution of the major part of the semiconductor integrated circuit device according to the second embodiment of the present invention. As shown in FIG. 14, instead of the sense amplifier reference potential generation circuit 5 for supplying the potential which does not depend on the temperature in FIG. 2, a sense amplifier reference potential generation circuit 31 for supplying the potential which depends on the temperature is disposed. The other constitution is the same as that of the first embodiment. As shown in FIG. 15, the sense amplifier reference potential indicates a value in accordance with the temperature characteristic similar to that of the signal window.

Figure 16:
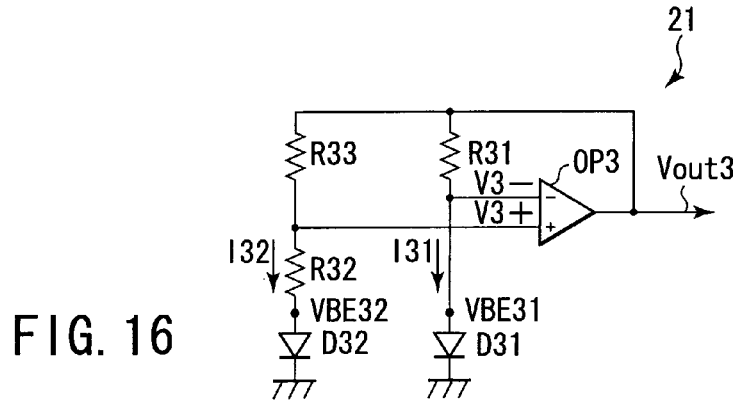
FIG. 16 is a diagram showing the reference potential generation circuit according to the second embodiment.

Next, a method will now be described in which the potential generation circuit 11 of FIG. 6 or the potential generation circuit 12 of FIG. 7 is used to set the reference potential of the sense amplifier to be dependent on the temperature in such a manner that the potential is constantly positioned in the intermediate point of the signal window. That is, in the same manner as in the first embodiment, the potential generation circuit 11 or 12 and the reference potential generation circuit 21 of FIG. 16 are used to generate the sense amplifier reference potential which is dependent on the temperature. It is to be noted that the circuit constitution of FIG. 16 is the same as that of FIG. 8. For the reference numerals of the components of FIG. 16, a part of the affix of each reference numeral of FIG. 8 is 3, and the digit of 10 is denoted with 3.

Assuming that the temperature characteristic of a reference potential Vref of the sense amplifier of FIG. 15 is +Q [mV/degree], a temperature characteristic +Y [mV/degree] to be possessed by Vout3 in FIG. 16 is as follows:

$$+Y = +Q \cdot (Vout3/Vref)[mV/degree] \quad (24).$$

Moreover, the following is necessary for Vout3 in FIG. 16 to have the temperature characteristic of +Y [mV/degree]:

$$(R33/R32) \cdot (k/q) \cdot \ln(I31/I32) = (+Y+2)/1000 \quad (25).$$

When the values of k and q are assigned to the above, the following results:

$$(R33/R32) \cdot \ln(I31/I32) = (R33/R32) \cdot \ln(N) \quad (26)$$
$$= (+Y+2) \cdot 11.6.$$

When a relation similar to that of (6) is used, R33 is as follows:

$$R33 = (I31/I32) \cdot R31 = N \cdot R31 \quad (27).$$

Moreover, from (27), R32 is as follows:

$$R32 = R33 \cdot \ln(N)/\{(+Y+2) \cdot 11.6\} \quad (28).$$

From Equation (27) obtained in this manner, the areas of diodes D31, D32 and R31 are used to determine R32. Here, R31 is determined by the consumed current permitted in the circuit. Subsequently, R32 is determined in accordance with Equation (28).

The same effect as that of the first embodiment is obtained by the semiconductor device of the second embodiment of the present invention. Furthermore, in the second embodiment, the sense amplifier reference potential generation circuit 5 of the sense amplifier 2 generates the potential which rises with the rise of the temperature. Therefore, even when the temperature changes, the reference potential is constantly positioned in the intermediate point of the signal window. Therefore, the margin between the read potential and the reference potential can be prevented from changing in accordance with the temperature. Therefore, the semiconductor integrated circuit device little in read error can be realized.

Third Embodiment

In addition to the characteristics of the first embodiment, the plate line driving potential has a dependence on the temperature greater than that of the first embodiment, in a third embodiment.

Figure 17:
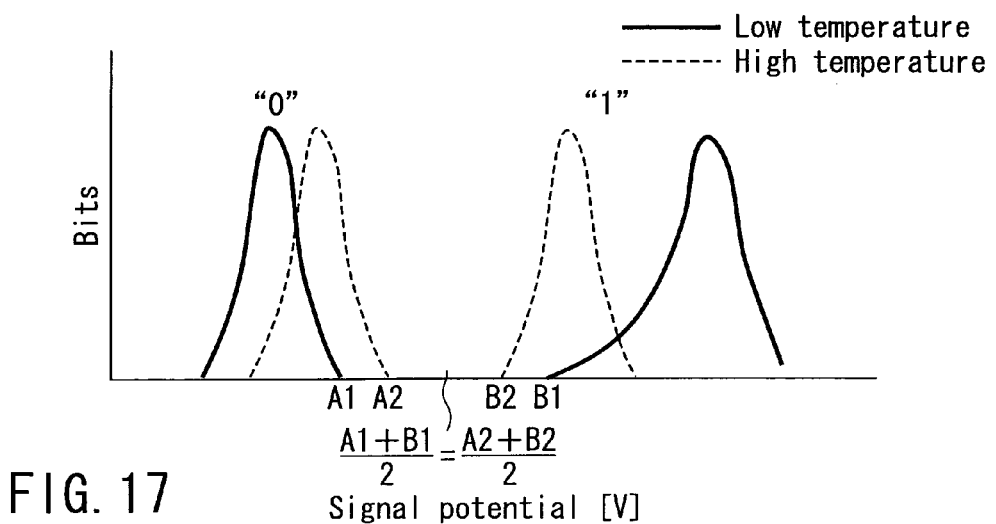
FIG. 17 is a diagram showing the "0" and "1" signal distribution at the high and low temperatures in a third embodiment.

As described in the second embodiment, the intermediate point of the signal window changes with the temperature. To solve the problem, when the temperature dependence is imparted to the plate line driving potential, the intermediate point of the signal window can be constant. FIG. 17 shows the "0" and "1" signal potential distributions at the high and low temperatures in the third embodiment. As shown in FIG. 17, when the plate line driving potential is decreased in accordance with the rise of the temperature, the signal potential distribution at the high temperature moves toward the right in FIG. 12. As a result, the intermediate point of the signal window at the high temperature agrees with that at the low temperature. Therefore, using the intermediate point as the reference potential of the sense amplifier, the constant signal margin can be secured regardless of the temperature. In the third embodiment, this technique is used, and is described in detail in Japanese Patent Application No. 2002-321563.

Figure 18:
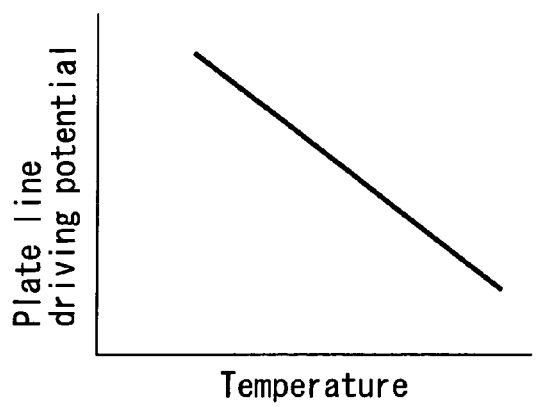
FIG. 18 is a diagram showing a relation between the plate line driving potential and temperature in the third embodiment.
Figure 19:
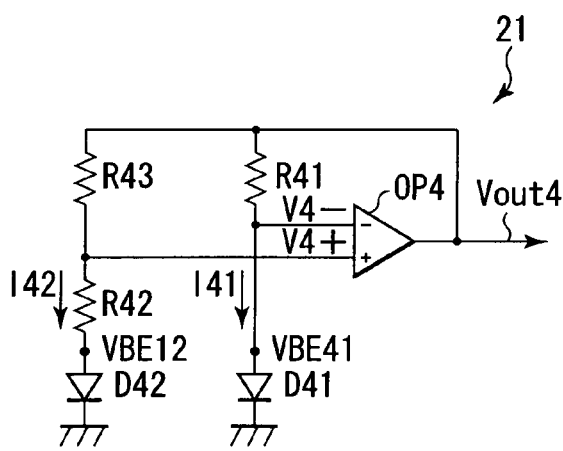
FIG. 19 is a diagram showing the reference potential generation circuit according to a fourth embodiment.

As described above, the constitution of the third embodiment is substantially the same as that of the first embodiment, and is different in the temperature characteristic of the plate line driving potential. That is, as shown in FIG. 18, an inclination of the temperature characteristic of the plate line driving potential is set so as to avoid the application of the voltage which is greater than the saturated voltage to the ferroelectric capacitor and to constantly set the intermediate point of the signal window to be constant. As a concrete constitution, the reference potential generation circuit 21 in the plate line driving potential generation circuit 1 has Vout4 shown in FIG. 19 so that the plate line driving potential has such temperature characteristic. It is to be noted that the circuit constitution of FIG. 19 is the same as that of FIG. 8. For the reference numerals of the components of FIG. 19, a part of the affix of each reference numeral of FIG. 8 is 4, and the digit of 10 is denoted with 4.

Assuming that the temperature characteristic of a plate line driving potential Vp1 of FIG. 18 is −P2 [mV/degree], a temperature characteristic −X2 [mV/degree] to be possessed by Vout4 in FIG. 19 is as follows:

$$-X2=-P2\cdot(Vout4/Vp1)[mV/degree] \quad (29),$$

where $$|-P2|>|-P1| \quad (30); \text{ and}$$

$$|-X2|>|-X1| \quad (31).$$

Moreover, the following is necessary for Vout4 in FIG. 19 to have the temperature characteristic of −X2 [mV/degree]:

$$(R43/R42)\cdot(k/q)\cdot 1n(I41/I42)=(-X2+2)/1000 \quad (32).$$

Subsequently, the equation is developed in the same manner as in FIG. 6, the following results:

$$R43=(I41/I42)\cdot R41=N\cdot R41 \quad (33);$$

and $$R42=R43\cdot 1n(N)/\{(-X2+2)\cdot 11.6\} \quad (34).$$

From Equations (33), (34) obtained in this manner, R42, R43 are determined.

The same effect as that of the first embodiment is obtained by the semiconductor device of the third embodiment of the present invention. Furthermore, in the third embodiment, the plate line driving potential generation circuit 1 generates the plate line driving potential having the set temperature characteristic in such a manner that the voltage greater than the saturated voltage is prevented from being applied to the ferroelectric capacitor and the intermediate point of the signal window is constant. Therefore, even when the temperature changes, the reference potential is constantly positioned in the intermediate point of the signal window, and the margin between the read potential and the reference potential can be prevented from changing in accordance with the temperature. Consequently, the semiconductor integrated circuit device little in read error can be realized.

Fourth Embodiment

Figure 20:
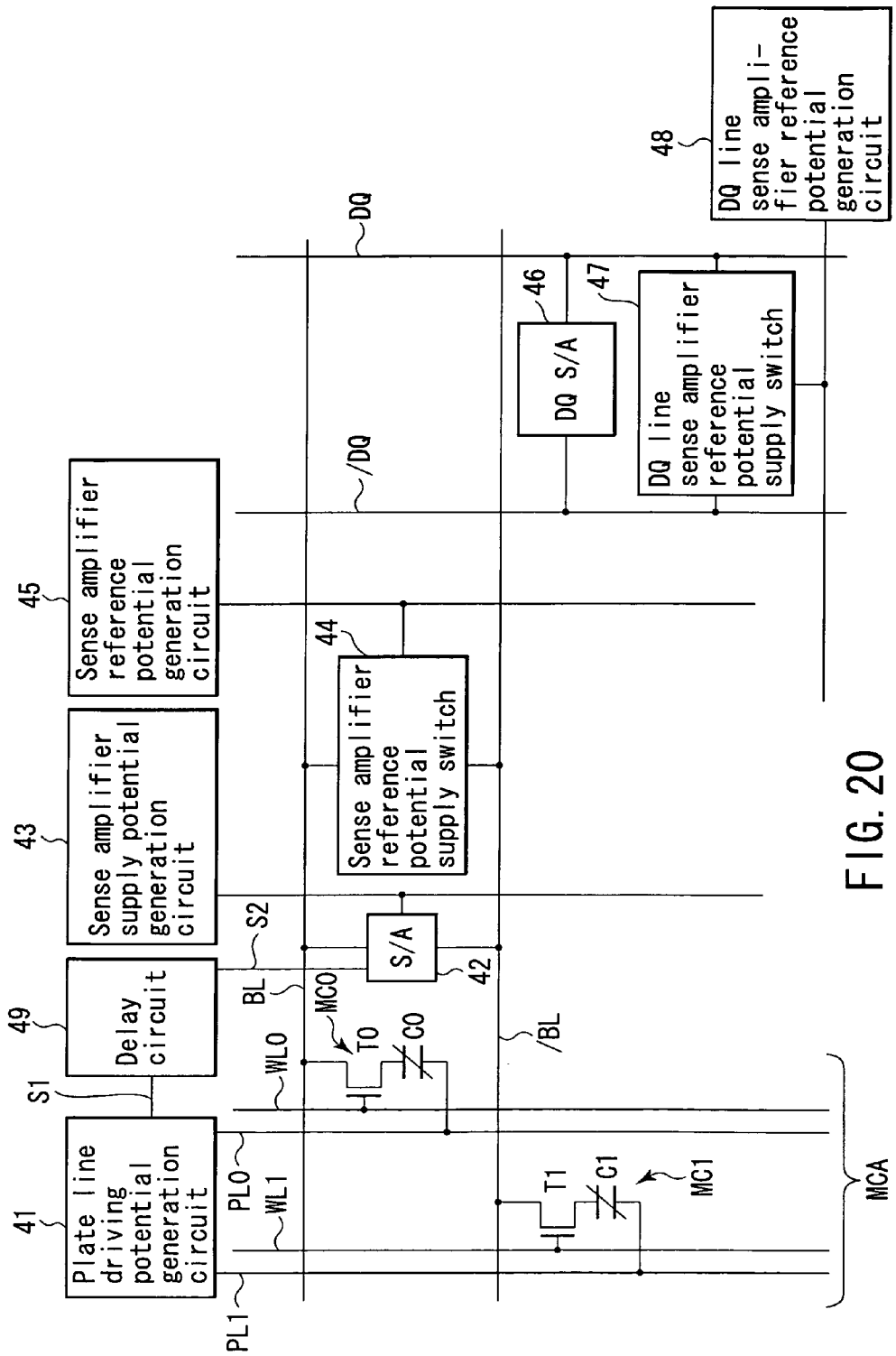
FIG. 20 is a diagram showing the constitution of the major part of the semiconductor integrated circuit device according to the fourth embodiment of the present invention.

A fourth embodiment relates to a time at which the voltage is applied to the ferroelectric capacitor. FIG. 20 is a diagram showing the constitution of the major part of the semiconductor device according to the fourth embodiment of the present invention. A connection relation between the components of FIG. 20 is the same as that of the first embodiment (FIG. 2). FIG. 20 is different from FIG. 1 in that each potential generation circuit does not have the dependence on the temperature a delay circuit 49 is disposed between a plate line driving potential generation circuit 41 and a sense amplifier 42.

The plate line driving potential generation circuit 41 drives the plate lines PL0, PL1, and simultaneously supplies a control signal S1 indicating this to the delay circuit 49. After elapse of a delay time which decreases with the rise of the temperature, the delay circuit 49 supplies a control signal S2 indicating activation of the delay circuit 49 to the sense amplifier 42. As a result, the sense amplifier 42 performs a sense amplification operation.

Similarly, when the driving of the plate lines ends, the plate line driving potential generation circuit 41 supplies the control signal S1 indicating this to the delay circuit 49. After the elapse of a predetermined delay time, the delay circuit 49 supplies the control signal S2 indicating non-activation of the sense amplifier to the sense amplifier. As a result, the sense amplifier 42 shifts to a non-activated state.

Figure 21:
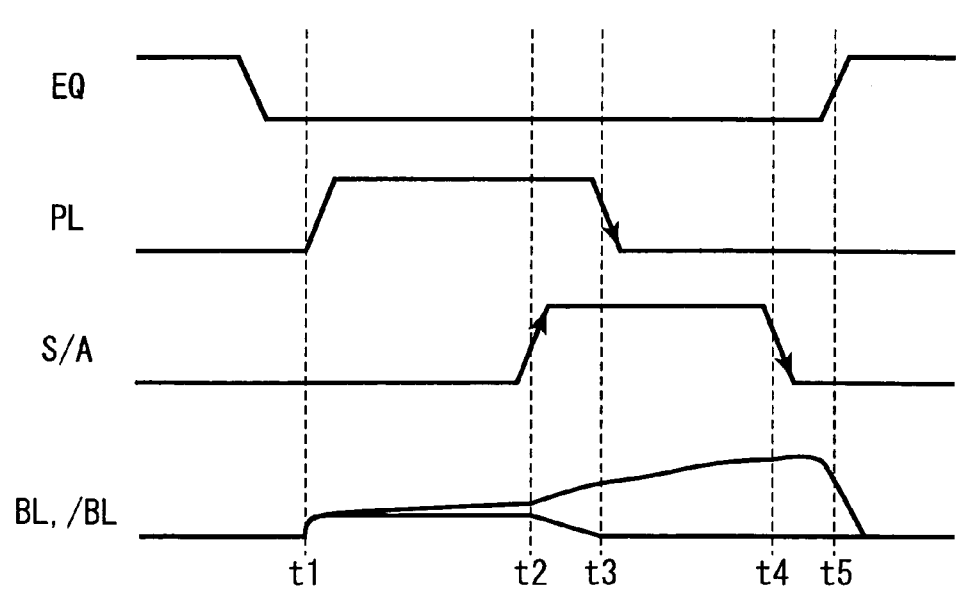
FIG. 21 is a diagram showing the potentials of major nodes at the low temperature in the fourth embodiment.

FIG. 21 is a timing chart of major nodes at the low temperature in the fourth embodiment of the present invention. When the data is read from the memory cell accompanied by a change from a standby state to an active state, the gate of an equalize transistor (not shown) for equalizing the bit lines BL, /BL is set to a low level from a high level to stop equalizing. Next, the plate line PL (PL0, PL1, and the like) connected to the cell from which information is read is driven at a high level at time t1, and accordingly a read voltage is applied to opposite ends of the ferroelectric capacitor of the memory cell and reference cell. As a result, the data read from the memory cell and reference cell is read into the bit lines BL, /BL. Next, a sense amplifier S/A is activated in response to the control signal S2 at a time t2 after the elapse of the delay time defined by the delay circuit 49 of FIG. 20 from the time t1. As a result, the potential difference between the bit lines BL, /BL is amplified.

Next, the plate line PL is set at a low level at time t3. A "0" signal rewrite voltage is applied to the opposite ends of the ferroelectric capacitor of the memory cell and reference cell between the times t2 and t3 ("0" signal rewrite time). Therefore, when the read data of the memory cell and reference cell is "0", the "0" data is rewritten into the memory cell and reference cell.

Next, the sense amplifier S/A is non-activated at a time t4 after the elapse of the delay time defined by the delay circuit 49 from the time t3. A "1" signal rewrite voltage is applied to the opposite ends of the ferroelectric capacitor of the memory cell and reference cell between the times t3 and t4 ("1" signal rewrite time). Therefore, when the read data of the memory cell and reference cell is "1" signal, the "1" data is rewritten into the memory cell and reference cell. The "1" signal rewrite time is set to a time required until a polarization amount is saturated at each temperature. Thereafter, the gate of the equalize transistor is set at the high level at a time t5, and the state shifts to a standby state.

Figure 22:
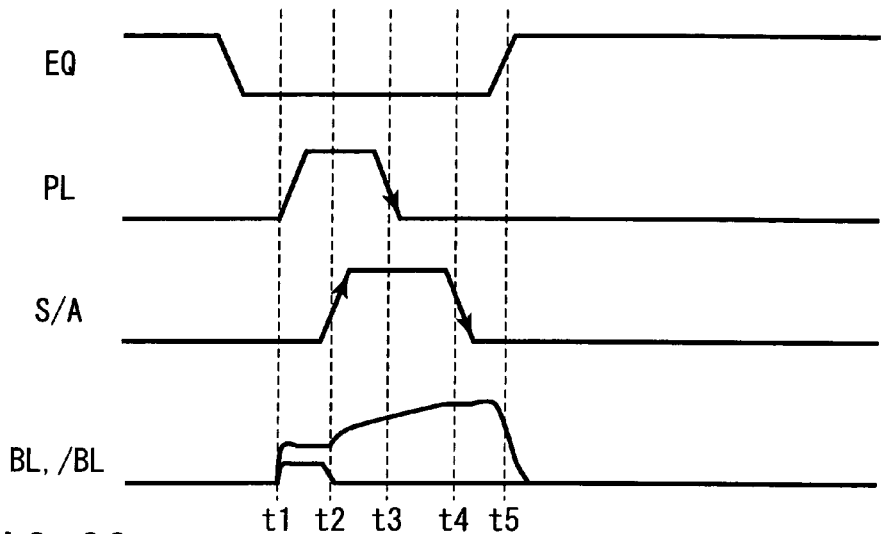
FIG. 22 is a diagram showing the potentials of the major nodes at the high temperature in the fourth embodiment.

FIG. 22 is a timing chart of the potentials of the major nodes at the high temperature in the fourth embodiment of the present invention. Each operation is the same as that of FIG. 21, but an operation timing differs. As shown in FIG. 22, since the delay time defined by the delay circuit 49 with the rise of the temperature decreases, a time (read time) between the times t1 and t2 is shorter than that at the low temperature. Moreover, the "1" signal rewrite time is shorter than that at the low temperature because of the decrease of the delay time. It is to be noted that the "0" signal rewrite time does not have the dependence on the temperature, and is constant in the same manner as in the related art.

Next, one example of the delay circuit 49 for realizing the above-described portion will hereinafter be described with reference to FIGS. 23 to 28.

Figure 23:
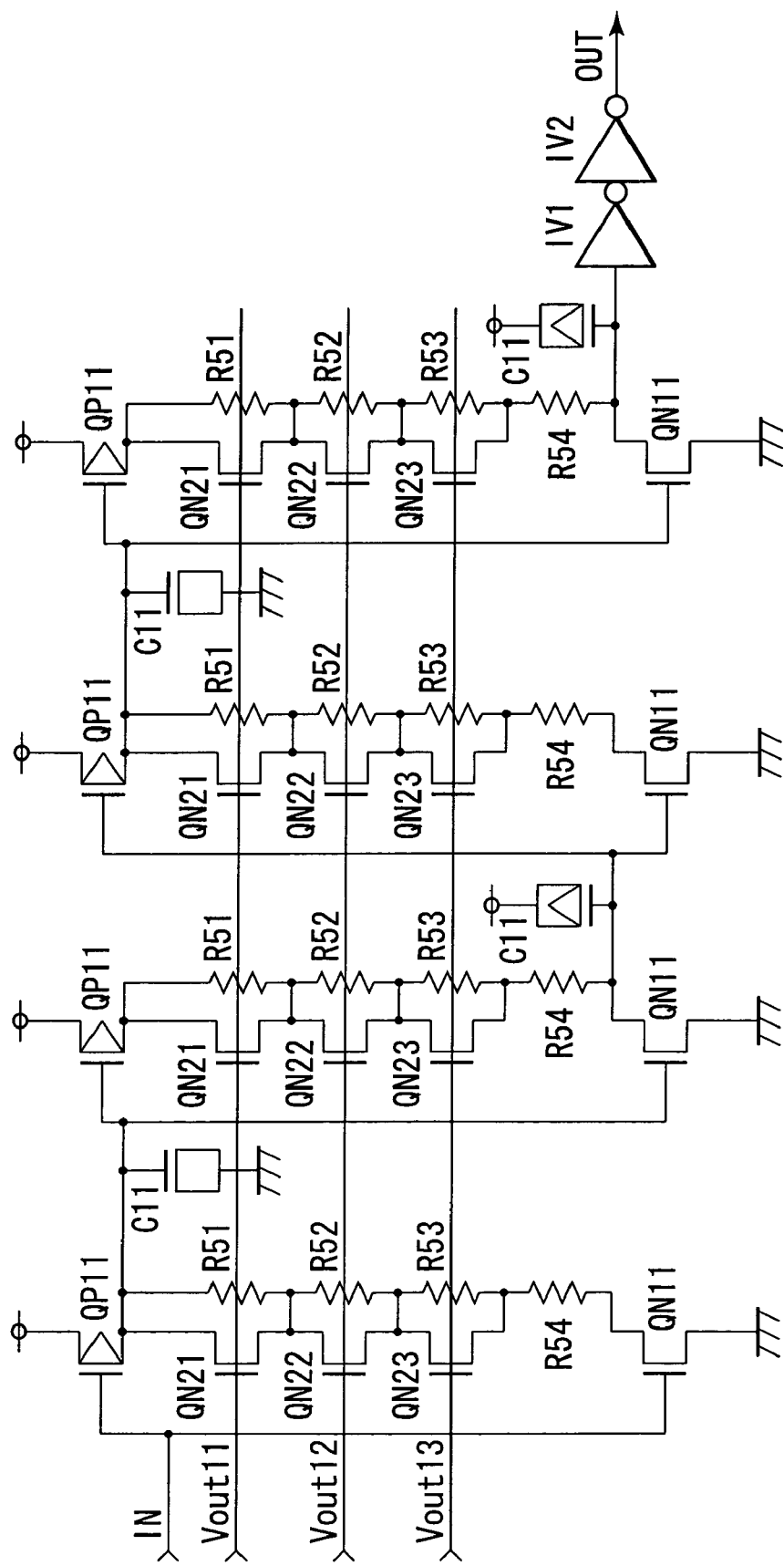
FIG. 23 is a diagram showing a part of a delay circuit in the fourth embodiment.

FIG. 23 is a circuit diagram showing a part of the delay circuit 49. An input signal IN corresponding to the control signal S1 of FIG. 20 is supplied to an inverter constituted of a PMOS transistor QP1 and an NMOS transistor QN1. Series-connected resistance elements R51 to R54 are connected between the transistors QP1, QN1. The resistance elements R51 to R53 are connected in parallel to NMOS transistors QN21 to QN23, respectively. Vout11 to Vout13 described later are supplied to the transistors QN21 to QN23.

The drain of a transistor QP11 is grounded via a capacitor C11, and is connected to the gates of transistors QP11, QN11 of the circuit in a second stage having the same constitution as that of the circuit in a first stage constituted of transistors QP11, QN11, QN21 to QN23, resistances R51 to R54. A connecting node of the resistance R54 of the circuit of the second stage to the transistor QN11 is connected to the power potential line via the capacitor C11, and to the gates of the transistors QP11, QN11 of the circuit of a third stage having the same constitution as that of the first stage. Similarly, the drain of the transistor QP11 of the third stage is connected to the one end of the capacitor C11 and the gates of the transistors QP11, QN11 of the circuit in a fourth stage. A signal taken from the connecting node of the resistance R54 of the circuit of the fourth stage to the transistor QN11 is supplied to one end of the capacitor C11, and is formed into an output signal OUT via a predetermined number (example: two) inverters IV1, IV2 for setting the delay time.

Figure 24:
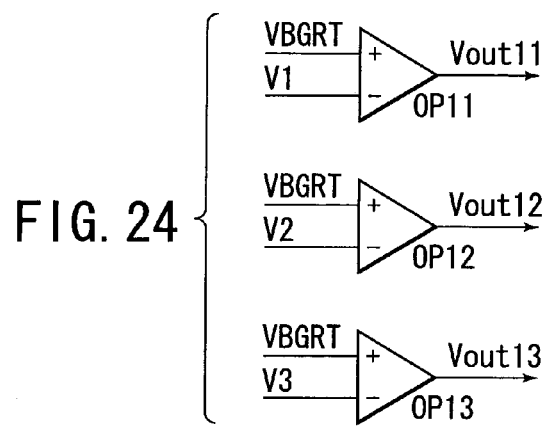
FIG. 24 is a diagram showing a part of the delay circuit in the fourth embodiment.

FIG. 24 is a circuit diagram showing a part of the delay circuit 49. The circuit generates a signal for controlling the operation of the transistors QN21 to QN23 of FIG. 23. As shown in FIG. 24, a potential VBGRT which rises dependent on the temperature is supplied to each non-reverse input end of operational amplifiers OP11 to OP13. Constant potentials V1 to V3 which do not have the dependence on the temperature are supplied to reverse input ends of the operational amplifiers OP11 to OP13. Here, a relation among the potentials V1 to V3 is V1<V2<V3. The operational amplifiers OP11 to OP13 output potentials VOUT11 to VOUT13, respectively.

Next, the operation of the circuit of FIGS. 23, 24 will be described. In a state in which the temperature is still low and before the potential VBGRT reaches a potential V1, VOUT11 to VOUT13 are not outputted, and the transistors QN21 to QN23 of FIG. 24 are off. Therefore, the resistance elements R51 to R54 are not bypassed, RC delay is maximum, and delay from the input of the input signal IN until the output of the output signal OUT is longest. With the rise of the temperature, the potential VBGRT rises, and Vout11, Vout12, Vout13 are successively and keep outputted. Therefore, when the transistors QN21, QN22, QN23 are successively turned on and stays on, the RC delay successively drops. As a result, the delay from the input of the input signal IN until the output of the output signal OUT successively shortens.

Figure 25:
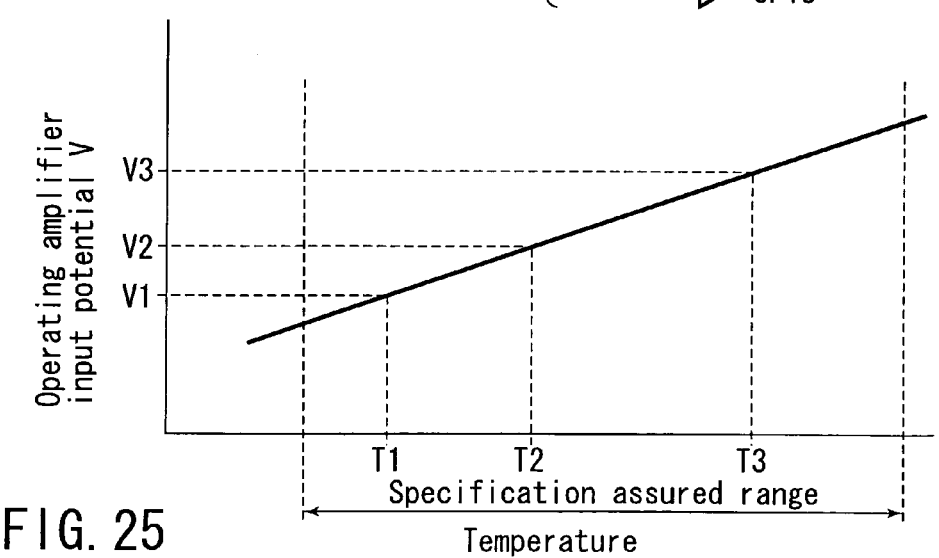
FIG. 25 is a diagram showing a relation between an operational amplifier input potential and temperature.

FIG. 25 shows a relation between the potential VBGRT and temperature. An assured range of specifications to be possessed by the ferroelectric capacitor is considered, the temperature characteristic shown in FIG. 25 is imparted to the potential VBGRT, and the potentials V1 to V3 of FIG. 23 are appropriately set. As a result, a control can be executed so as to successively turn on the transistors QN21 to QN23 of FIG. 23 as described above.

A BGRT circuit is used to generate the potential VBGRT in the same manner as in the first and second embodiments. Concretely, the temperature characteristic shown in FIG. 25 is imparted to Vout3 of FIG. 17. For Vout3 of FIG. 16 to have the temperature characteristic of +X [mV/degree], the followings are established in the same manner as in Equations (27) and (28):

$$R33=(I31/I32) \cdot R31 = N \cdot R31 \quad (35);$$

and $$R32 = R33 \cdot 1n(N)/\{(+X+2) \cdot 11.6\} \quad (36).$$

From Equations (35), (36), R31, R32 are determined.

Figure 26:
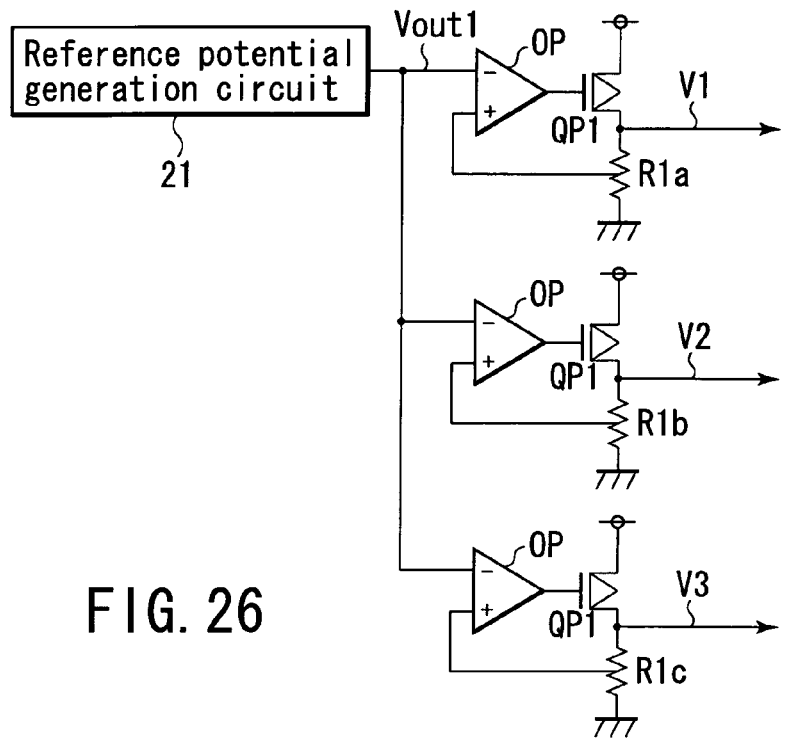
FIG. 26 is a circuit diagram showing one example of the potential generation circuit according to the fourth embodiment.
Figure 27:
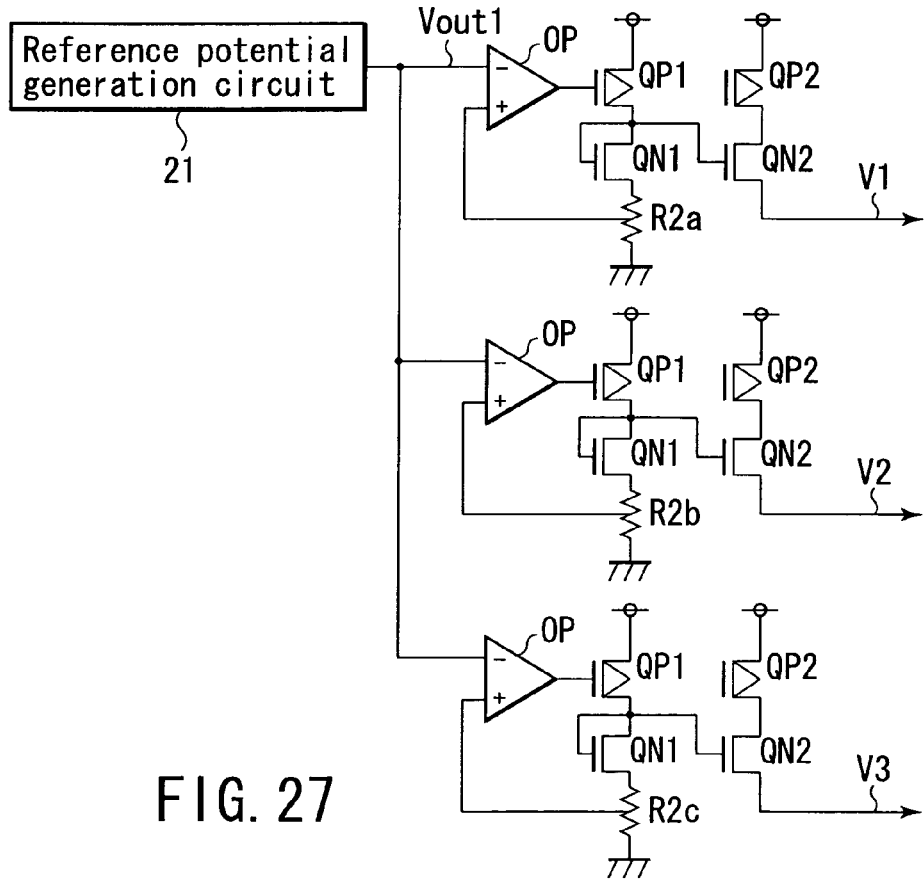
FIG. 27 is a circuit diagram showing one example of the potential generation circuit according to the fourth embodiment.

The potentials V1 to V3 which do not depend on the temperature can also be generated in a method similar to that of the first embodiment. Concretely, for example, as shown in FIG. 26, the number of circuits of FIG. 6 corresponding to the number of potentials to be generated are arranged. When the values of resistance elements R1a to R1c are changed, the potentials V1 to V3 indicating desired values not dependent on the temperature can be generated. As shown in FIG. 27, circuits of FIG. 7 are arranged, and the values of resistance elements R2a to R2c can be changed to generate the potentials V1 to V3.

Figure 28:
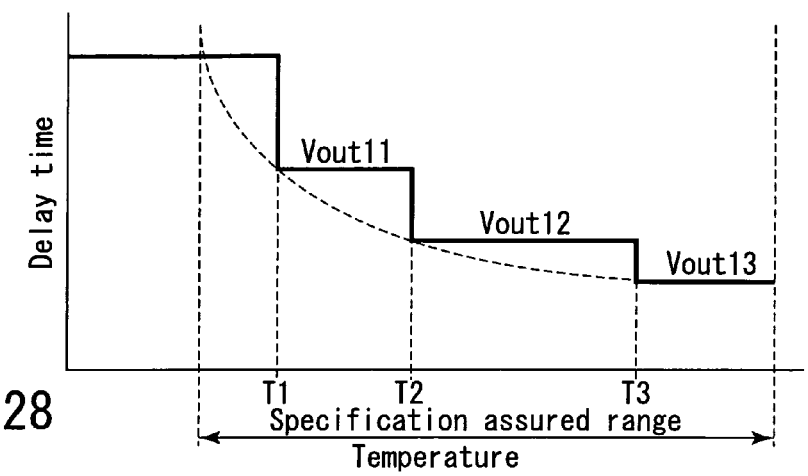
FIG. 28 is a diagram showing a relation between a delay time of the delay circuit and temperature according to the fourth embodiment.

FIG. 28 shows a relation of the delay time between the input signal IN and output signal OUT of the delay circuit of FIG. 23 with respect to the temperature. A broken line in FIG. 28 shows a relation between a time required for saturation of the polarization amount of the ferroelectric capacitor with the polarization reverse and temperature. As shown in FIG. 28, the delay time indicates a different value at each temperature. The temperature characteristic of the delay time is approximate to that of a saturation time. When the temperature rises at T1 to T3, Vout11 to Vout13 are successively and keep outputted. When the number (three in the present example) of potentials for use in the circuits of FIGS. 23 to 27, a solid line of FIG. 28 approaches the characteristic shown by the broken line.

In the semiconductor integrated circuit device of the fourth embodiment of the present invention, a time for applying the voltage to the ferroelectric capacitor decreases with the rise of temperature during the control in the operation of the ferroelectric memory involving the operation for reversing the polarization amount of the ferroelectric capacitor. This time is set to a time required for the polarization amount to be saturated after the polarization reverse at each temperature. Therefore, the fatigue or imprint of the ferroelectric capacitor can be prevented from occurring by continuous application of an unnecessary voltage even after reaching the saturated voltage. Therefore, the reliability of the semiconductor integrated circuit device can be enhanced.

Fifth Embodiment

A fifth embodiment is used in addition to the fourth embodiment. The "0" signal rewrite time has a length depending on the temperature.

In general, it is considered that the saturation time changes with the temperature only during the polarization reverse of the ferroelectric capacitor. However, ferroelectric components are partially included even in a region which does not involve the polarization reverse, and the saturation time depends on the temperature even in this region. Therefore, in the fifth embodiment, the "0" signal rewrite time is allowed to depend on the temperature in the same manner as in the fourth embodiment.

Figure 29:
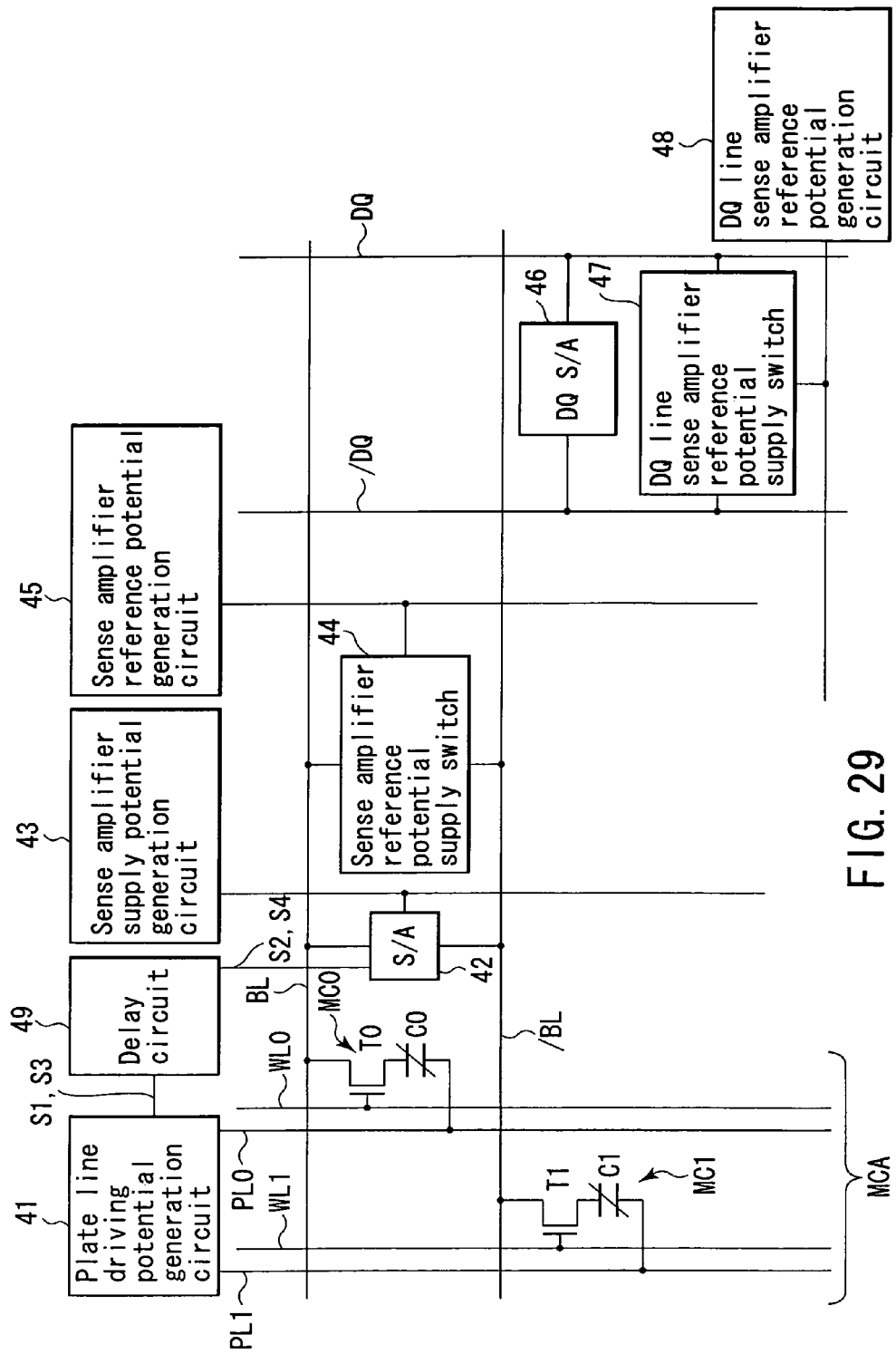
FIG. 29 is a diagram showing the constitution of the major part of the semiconductor integrated circuit device according to a fifth embodiment of the present invention.

FIG. 29 is a diagram showing the constitution of the major part of the semiconductor integrated circuit device according to the fifth embodiment of the present invention. The constitution is substantially similar to that of the fourth embodiment, and is different in that a control signal S4 indicating the activation of the sense amplifier 42 is supplied to the delay circuit 49, and the delay circuit 49 supplies a control signal S3 delayed in accordance with the temperature to the plate line driving potential generation circuit 41. When the control signal S3 is supplied, the plate line driving potential generation circuit 41 controls the plate line driving potential at the low level.

Figure 30:
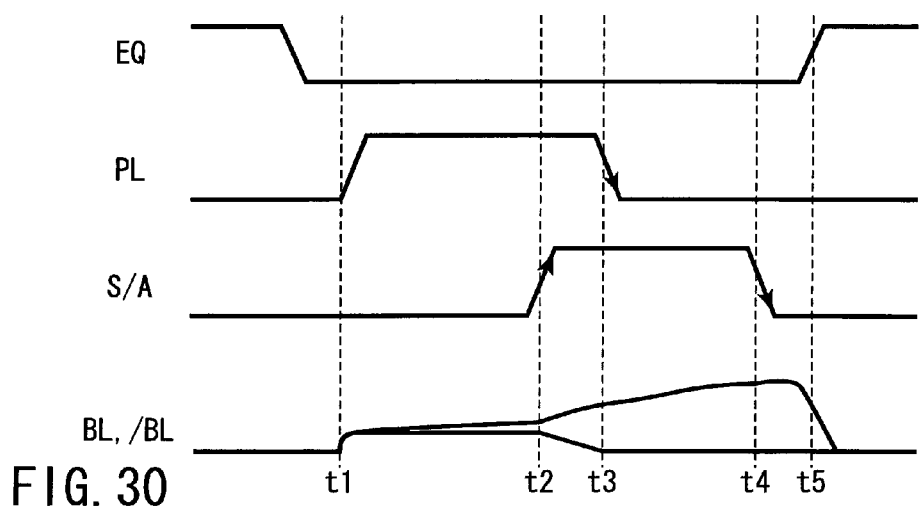
FIG. 30 is a diagram showing the potentials of the major nodes at the low temperature in the fifth embodiment.
Figure 31:
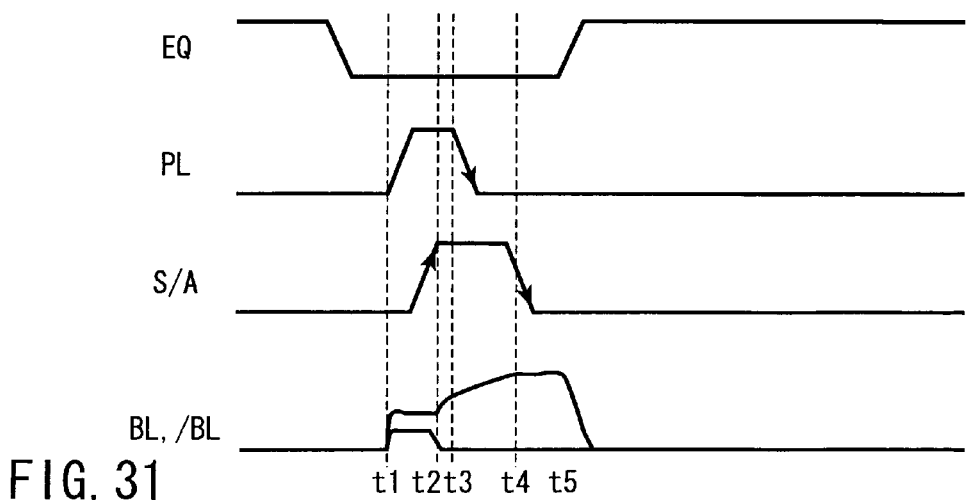
FIG. 31 is a diagram showing the potentials of the major nodes at the high temperature in the fifth embodiment.

FIGS. 30 and 31 are timing charts of the potentials of the major nodes at the high and low temperatures in the fifth embodiment of the present invention. As shown in FIGS. 30, 31, in addition to the read time and "1" signal rewrite time, the "0" signal rewrite time also shortens at the low temperature. The delay time from the activation of the sense amplifier S/A until the control of the plate line driving potential PL at the low level, which defines the read time, changes in accordance with the temperature. The read time is set to a time required for the saturation of the polarization amount at each temperature.

In the semiconductor integrated circuit device of the fifth embodiment of the present invention, the same effect as that of the fourth embodiment is obtained. Furthermore, even when the polarization reverse is not involved, the time required for the saturation of the polarization amount shortens with the rise of the temperature. Therefore, even in the region supposed not to include the ferroelectric components, the fatigue or imprint can be prevented from occurring by the continuous application of the unnecessary voltage to the ferroelectric capacitor even after the saturation of the polarization amount. Consequently, the reliability of the semiconductor integrated circuit device can be enhanced.

Sixth Embodiment

A sixth embodiment relates to a modification example of the fourth and fifth embodiments, and relates to another example of the delay circuit 49.

Figure 32:
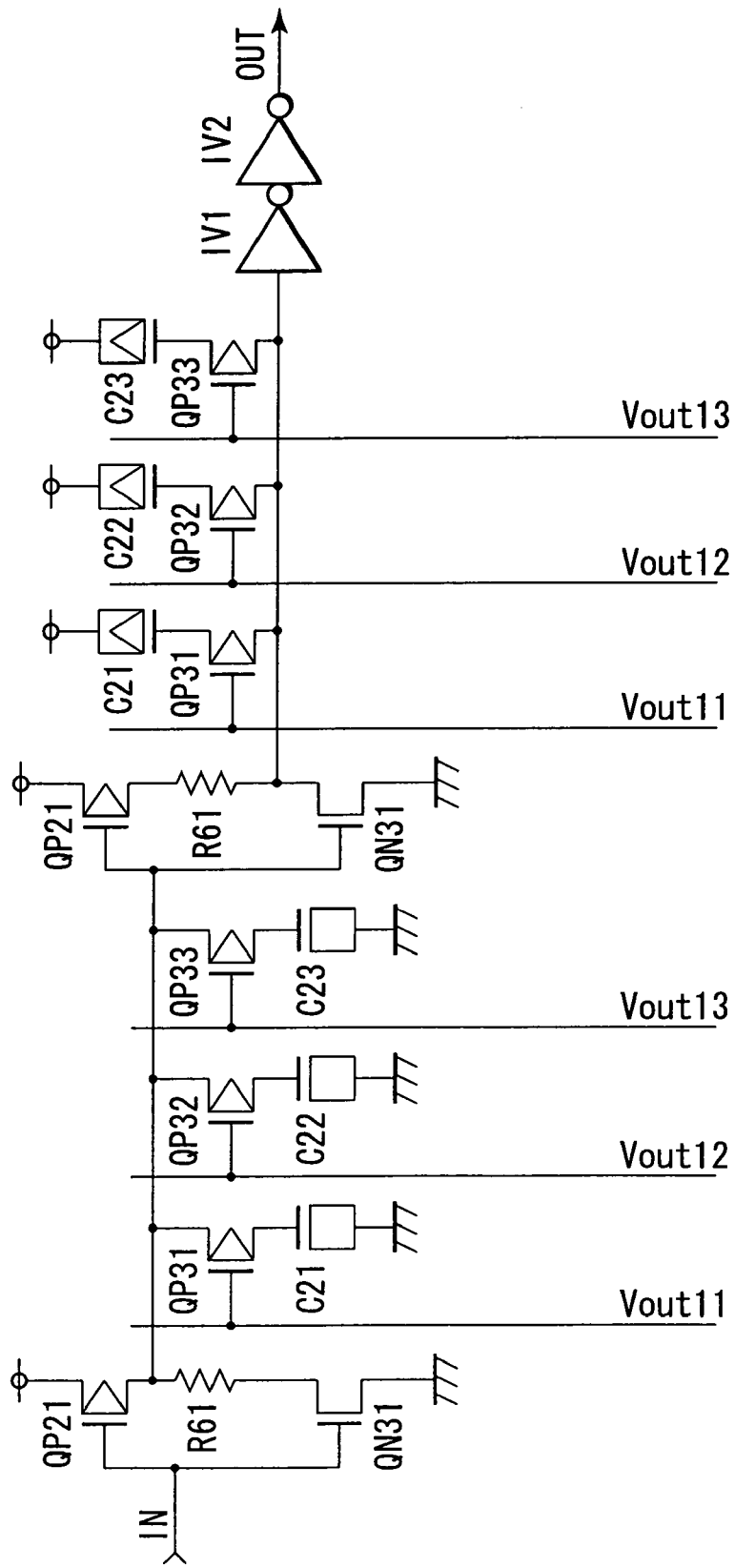
FIG. 32 is a diagram showing a part of the delay circuit according to a sixth embodiment of the present invention.
Figure 33:
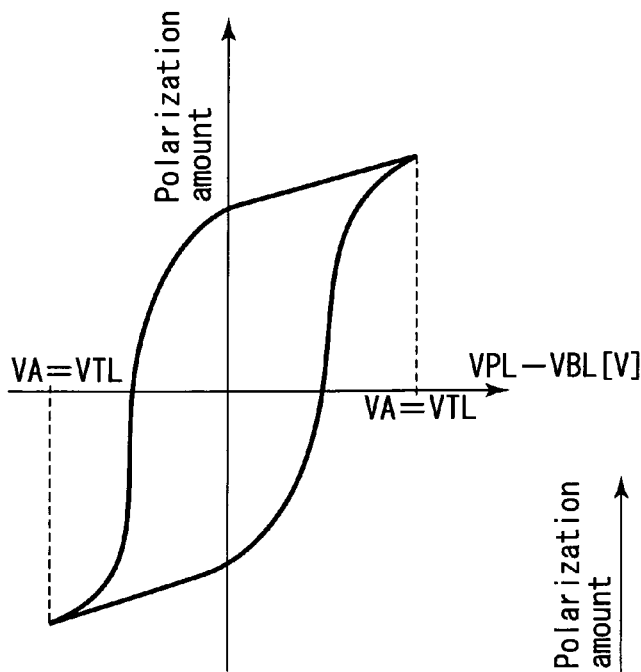
FIG. 33 is a diagram showing a hysteresis characteristic of a ferroelectric capacitor at the low temperature.
Figure 34:
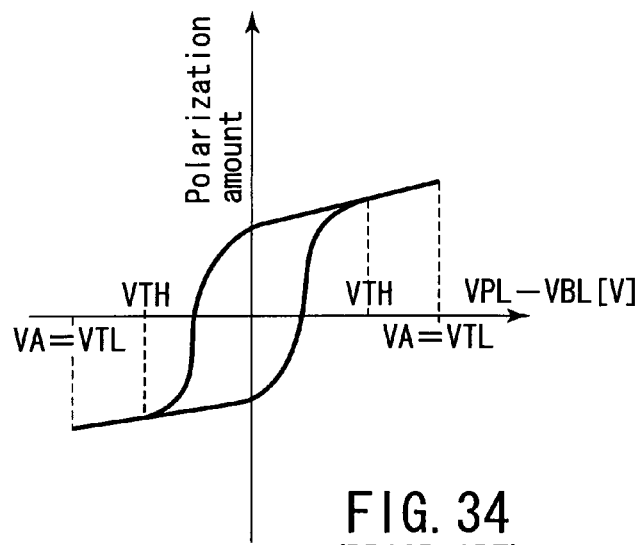
FIG. 34 is a diagram showing the hysteresis characteristic of the ferroelectric capacitor at the high temperature.
Figure 35:
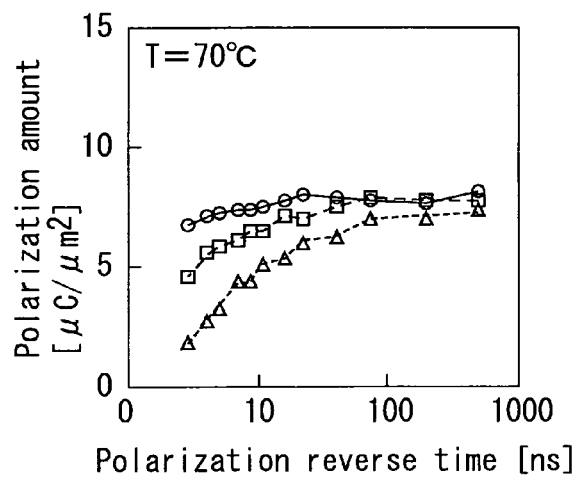
FIG. 35 is a diagram showing a relation between a polarization reverse time at a temperature of 70° C. and a polarization amount.
Figure 36:
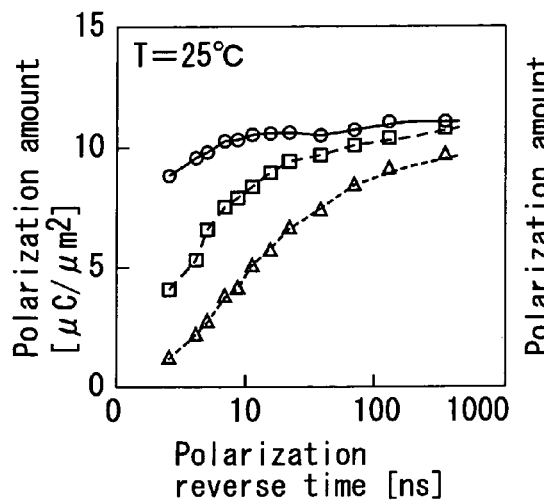
FIG. 36 is a diagram showing a relation between a polarization reverse time at a temperature of 25° C. and a polarization amount.
Figure 37:
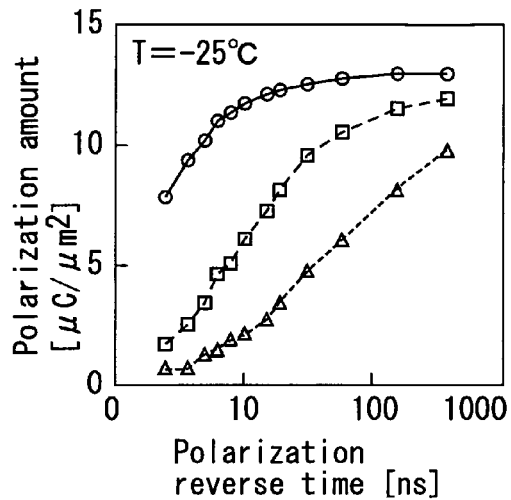
FIG. 37 is a diagram showing a relation between a polarization reverse time at a temperature of −25° C. and a polarization amount.
Figure 38:
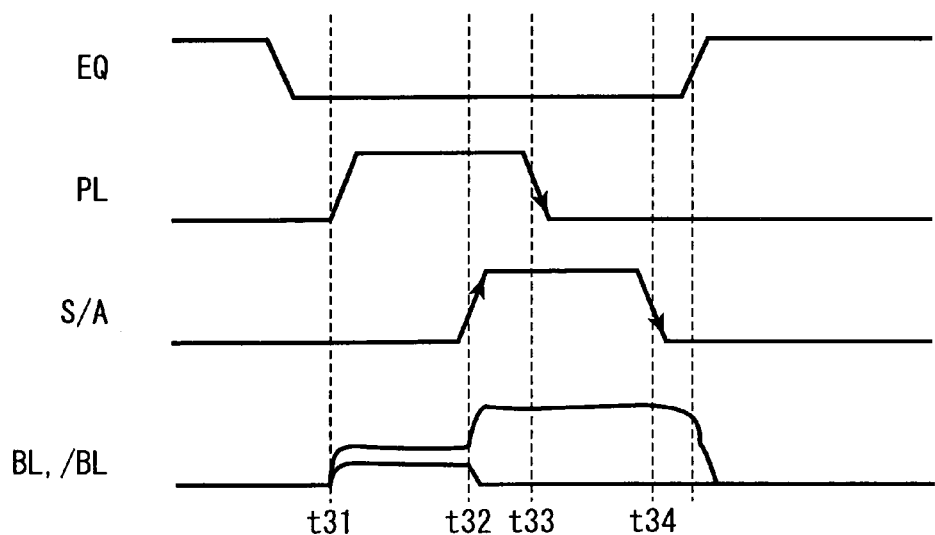
FIG. 38 is a timing chart of the major nodes of a conventional ferroelectric memory.

FIG. 32 is a circuit diagram showing a part of the semiconductor integrated circuit device of the sixth embodiment of the present invention. The circuit of FIG. 32 is used instead of that of FIG. 23. As shown in FIG. 32, the input signal IN is supplied to the inverter constituted of series-connected PMOS transistor QP31, resistance element R61, and NMOS transistor QN31. One end of each of PMOS transistors QP31, QP32, QP33 is connected to the connecting node between the transistor QP31 and the resistance element R61. The other end of each of the transistors QP31, QP32, QP33 is grounded via capacitors C21, C22, C23, respectively. The potentials Vout11, Vout12, Vout13 of FIG. 24 are supplied to the gates of the transistors QP31, QP32, QP33, respectively.

The connecting node between the transistor QP21 and resistance element R61 is connected to the gates of transistors QP21, QN31 of the circuit of the second stage having the same constitution as that of the circuit of the first stage constituted of transistors QP21, QN31, QP31 to QP33, and resistance element R61. The connecting node between the resistance element R61 and the transistor QN31 of the circuit of the second stage is connected to one end of each of the transistors QP31, QP32, QP33. The other end of each of the transistors QP31, QP32, QP33 is connected to the power potential line via the capacitors C21, C22, C23, respectively. The signal taken from the connecting node of the resistance element R61 to the transistor QN31 of the circuit of the second stage turns to the output signal OUT via the inverters IV1, IV2.

In the circuit of FIG. 32, the transistors QP31, QP32, QP33 are successively turned off and keep off, and accordingly the RC delay successively drops in the same manner as in the circuit of FIG. 23. When capacity values of the capacitors C21 to C23 are appropriately set, it is possible to realize the delay circuit whose delay time drops with the rise of the temperature.

By the semiconductor integrated circuit device of the sixth embodiment of the present invention, the same effect as that of the fourth and fifth embodiments is obtained.

The semiconductor integrated circuit device of the first to sixth embodiments can be used in various applications. Concretely, the device can be applied to a single memory, an embedded memory, IC card, and the like. Since an assured temperature differs with the mode of the application, the temperature and range indicated by the above-described low and high temperatures differ with the application. In a versatile memory, the range is −40 to 85° C. Even for the versatile memory, when the use is limited to that indoors, the range is 0 to 70° C. Moreover, a memory exclusive for cars indicates a range of −40 to 125° C.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array including a memory cell having a ferroelectric capacitor, the memory cell having a first electrode and a second electrode;
a first bit line electrically connected to the first electrode;
a second bit line complementary to the first bit line;
a first potential generation circuit which supplies a first potential to the second electrode to apply a voltage dropping at a first rate of change with a rise of temperature to the ferroelectric capacitor, the first rate of change being equal to dependence on temperature possessed by a saturated voltage of the ferroelectric capacitor; and
a sense amplifier which amplifies a potential difference between the first bit line and the second bit line.

2. The device according to claim 1, further comprising:
a third potential generation circuit supplying a potential which rises at a third rate of change with the rise of temperature as a reference potential to the second bit line.

3. The device according to claim 2, wherein the third rate of change is equal to a rate of change, which is dependant on the rise of temperature, of an intermediate value between a maximum value at a "0" data read time from the ferroelectric capacitor and a minimum value at a "1" data read time.

4. A semiconductor integrated circuit device comprising:
a memory cell array including a memory cell having a ferroelectric capacitor, the memory cell having a first electrode and a second electrode;
a first bit line electrically connected to the first electrode;
a second bit line complementary to the first bit line;
a first potential generation circuit which supplies a first potential to the second electrode to apply a voltage dropping at a first rate of change with a rise of temperature to the ferroelectric capacitor, the first rate of change being imparted with a dependence on temperature so that an intermediate value between a maximum value when a "0" data is read from the ferroelectric capacitor and a minimum value when a "1" data is read is constant regardless of the temperature; and a sense amplifier which amplifies a potential difference between the first bit line and the second bit line.

5. A semiconductor integrated circuit device comprising:
a memory cell array including a memory cell having a ferroelectric capacitor as a storage element, the memory cell having a first electrode and a second electrode;
a first bit line electrically connected to the first electrode;
a second bit line complementary to the first bit line;
a sense amplifier which amplifies a potential difference between the first bit line and the second bit line; and
a first potential generation circuit supplying a voltage as a power potential of the sense amplifier, the voltage dropping at a first rate of change with a rise of temperature.

6. The device according to claim 5, wherein the first rate of change is equal to dependence on temperature possessed by a saturated voltage of the ferroelectric capacitor.

7. The device according to claim 5, further comprising:
a second potential generation circuit supplying a potential which rises at a second rate of change with the rise of temperature as a reference potential to the second bit line.

8. The device according to claim 7, wherein the second rate of change is equal to a rate of change, which is dependant on the rise of temperature, of an intermediate value between a maximum value at a "0" data read time from the ferroelectric capacitor and a minimum value at a "1" data read time.

9. The device according to claim 5, further comprising:
a second potential generation circuit which supplies a potential to the second electrode to apply a voltage dropping at a second rate of change with the rise of temperature to the ferroelectric capacitor.

10. The device according to claim 9, wherein the first rate of change is equal to the second rate of change.

11. The device according to claim 9, wherein the second rate of change or the first rate of change is equal to dependence on temperature possessed by a saturated voltage of the ferroelectric capacitor.

12. The device according to claim 9, further comprising:
a third potential generation circuit supplying a potential which rises at a third rate of change with the rise of temperature as a reference potential to the second bit line.

13. The device according to claim 12, wherein the third rate of change is equal to a rate of change, which is dependant on the rise of temperature, of an intermediate value between a maximum value at a "0" data read time from the ferroelectric capacitor and a minimum value at a "1" data read time.

14. The device according to claim 9, wherein the second rate of change is imparted with a dependence on temperature so that an intermediate value between a maximum value when a "0" data is read from the ferroelectric capacitor and a minimum value when a "1" data is read is constant regardless of the temperature.

15. A semiconductor integrated circuit device comprising:
a memory cell array including a memory cell having a ferroelectric capacitor as a storage element, the memory cell having a first electrode and a second electrode;
a first bit line electrically connected to the first electrode;
a second bit line complementary to the first bit line; and
a circuit which supplies a first potential to the second electrode to read information, a time for which the first potential is supplied dropping with a rise of temperature, a dependence on temperature of the time for which the first potential is supplied being equal to that of a time which the polarization of the ferroelectric capacitor needs to reverse.

16. A semiconductor integrated circuit device comprising:
a memory cell array including a memory cell having a ferroelectric capacitor as a storage element, the memory cell having a first electrode and a second electrode;
a first bit line electrically connected to the first electrode;
a second bit line complementary to the first bit line;
a first circuit which supplies a first potential to the second electrode to read information;
a sense amplifier which amplifies a potential difference between the first bit line and the second bit line; and
a second circuit which supplies a second potential as a power potential of the sense amplifier, a time for which the second potential is supplied dropping with a rise of temperature after the first potential is set at a low level.

17. The device according to claim 16, wherein a dependence on temperature of the time is equal to that of a time which the polarization of the ferroelectric capacitor needs to reverse.

* * * * *